United States Patent [19]

Lee

[11] Patent Number: 5,559,844
[45] Date of Patent: Sep. 24, 1996

[54] BINARY COUNTER WITH SPED-UP RIPPLE CARRY

[75] Inventor: Si-Yeol Lee, Kyungki-do, Rep. of Korea

[73] Assignee: Samsung Electronics Co., Ltd., Suwon, Rep. of Korea

[21] Appl. No.: 337,503

[22] Filed: Nov. 8, 1994

[30] Foreign Application Priority Data

Nov. 8, 1993 [KR] Rep. of Korea .................. 23598/1993

[51] Int. Cl.$^6$ .................................................. H03K 21/00
[52] U.S. Cl. ................................ 377/116; 377/81
[58] Field of Search ..................... 377/116, 117, 377/77, 80, 81

[56] References Cited

U.S. PATENT DOCUMENTS

| | | | |
|---|---|---|---|
| 4,741,006 | 4/1988 | Yamaguchi et al. | 377/116 |
| 4,780,894 | 10/1988 | Watkins et al. | 377/34 |
| 4,924,484 | 5/1990 | Grasso et al. | 377/116 |

*Primary Examiner*—John S. Heyman

*Attorney, Agent, or Firm*—Allen LeRoy Limberg; Stephen R. Whitt; Charles R. Donohoe

[57] ABSTRACT

A binary counter or binary-coded-arithmetic counter uses local look-ahead to speed up ripple carry propagation. A succession of counter stages therein can be identified by respective consecutive ordinal numbers assigned in accordance with the order of carry propagation. Each counter stage receives a respective carry input and supplies a respective output signal, and each counter stage identified by even number supplies a respective complemented output signal. Each counter stage identified by odd number has a respective carry generation circuit for supplying a respective carry output signal which includes a NAND gate responsive to carry input to that counter stage and responsive to output signal from that counter stage, carry input for the next counter stage being supplied in response to the NAND gate response. Each counter stage identified by even number has a respective carry generation circuit for supplying a respective carry output signal which includes a NOR gate responsive to the NAND gate response used for determining carry input for that counter stage and responsive to complemented output signal from that counter stage, carry input for the next counter stage being supplied in response to said NOR gate response.

50 Claims, 13 Drawing Sheets

| FIG. 3A | FIG. 3B | FIG. 3C |

FIG. 3

| FIG. 5A | FIG. 5B | FIG. 5C |

FIG. 5

BINARY COUNTER WITH SPED-UP RIPPLE CARRY

The invention relates to binary counters and, more particularly, to binary counters with carry propagation faster than that provided by conventional ripple carry.

BACKGROUND OF THE INVENTION

Many customary designs for binary counters employ a plurality of triggered flip-flops, one for each stage of the counter. In a type of binary counter referred to as a "synchronous binary counter", the respective triggering circuit for each of the plurality of triggered flip-flops is arranged to respond to a common clock that periodically recurs. The rate at which the clock can recur is limited, since the period of the clock should exceed the longest time it takes for carries to propagate from the earliest counter stage supplying the least significant bit of the binary count to the last counter stage supplying the most significant bit of the binary count. In so-called "ripple carry" procedures, the carry generated by each earlier counter stage is supplied to the succeeding counter stage before that succeeding counter stage generates a carry, so carrier propagation time increases proportionally with the number of counter stages. Only a modest amount of digital hardware is required to implement ripple carry procedures.

In so-called "look-ahead carry" procedures, the carries are not successively generated, but are generated substantially simultaneously. The carry supplied to each counter stage is obtained by decoding the previous condition of all earlier counter stages being just below the roll-over count for which a carry should be generated and then furnishing the carry in accordance with the subsequent clock signal. The use of a plural-input AND gate structure as a respective "look-ahead" decoder for each counter stage presents layout and interconnection problems in monolithic integrated circuitry, particularly with regard to the later counter stages, as the inputs from earlier counter stages to the plural-input AND gate structures grow in number. More digital hardware than a good designer likes is required for implementing the plural-input AND gate structure as the number of inputs goes up in the later counter stages. Carry generation that requires fewer inputs from earlier counter stages would be preferred if such carry generation would provide carry propagation faster than that provided by ripple carry.

Synchronous binary counters are useful in generating sequential addresses for semiconductor random-access memory (RAM) using a serial output port and can be integrated with the RAM within the same monolithic integrated circuit. In such context the layout and interconnection problems associated with known "look-ahead carry" techniques are particularly onerous. At the same time, the limitations on synchronous clock rate imposed by "ripple carry" cannot be tolerated in many applications that utilize a serial output port;

SUMMARY OF THE INVENTION

A binary counter alternately uses ripple carry and look-ahead for generating carries for its successive stages, thus achieving carry propagation faster than that provided by using ripple carry for all counter stages. Look-ahead gates that refer back to the earliest counter stages are avoided as much as possible, and look-ahead is kept local insofar as possible, so as not to require look-ahead gates with large numbers of inputs.

An aspect of the invention is embodied in a binary counter including first, second and third successive counter stages. The output signal from the first counter stage is selectively toggled in response to a clock signal and a zeroeth carry signal. The output signal from the second counter stage is selectively toggled in response to the clock signal and a first carry signal. The output signal from the third counter stage is selectively toggled in response to the clock signal and a second carry signal. The first carry signal is generated as a ripple carry by inverting the output of a first NAND gate responding to the zeroeth carry signal and the output signal from the first counter stage. The second carrier is generated as a local look-ahead carry by a first NOR gate responding to the first NAND gate response and an inverted or complemented output signal from the second counter stage.

A further aspect of the invention is embodied in a binary counter as described in the previous paragraph including first, second, third and fourth successive counter stages, output signal from the fourth counter stage being selectively toggled in response to a clock signal and a third carry signal. The third carry signal is generated as a ripple carry by inverting the output of a second NAND gate responding to the second carry signal and an output signal from the third counter stage.

A still further aspect of the invention is embodied in a binary counter as described in the previous paragraph including first, second, third, fourth and fifth successive counter stages, the fifth counter stage being selectively toggled in response to a clock signal and a fourth carry signal. The fourth carry signal is generated as a local look-ahead carry by a second NOR gate responding to the second NAND gate response and an inverted or complemented output signal from the fourth counter stage.

An even further aspect of the invention is embodied in a binary counter as described in the previous paragraph including first, second, third, fourth, fifth and sixth successive counter stages, the sixth counter stage being selectively toggled in response to a clock signal and a fifth carry signal. The fifth carry signal originates from a third NAND gate receiving, as input signals thereto, an output signal from the fifth counter stage, the fourth carry signal, and the zeroeth carry signal. The fifth carry is generated as a ZERO by a ripple carry procedure, but is generated as a ONE by look-ahead that in certain situations speeds up resetting of the counter.

DETAILED DESCRIPTION

Figure 1:
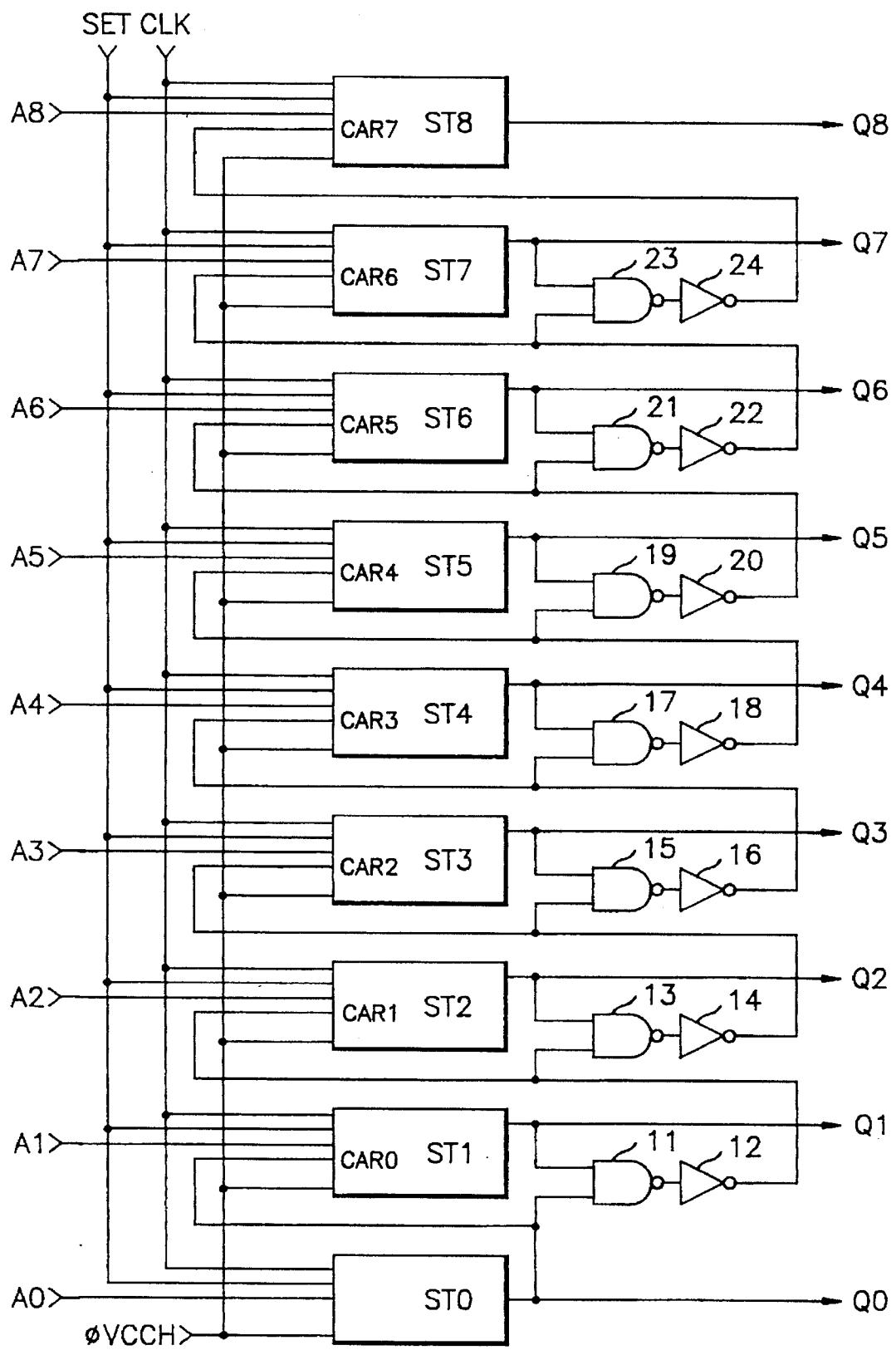
FIG. 1 is a schematic diagram of a prior-art synchronous binary counter.

FIG. 1 shows one example of a synchronous binary counter designed for inclusion in a semiconductor memory device as disclosed in Korean patent application No. 93-7127, which is incorporated herein by reference. The FIG. 1 synchronous binary counter includes nine counter stages ST0, ST1, ST2, ST3, ST4, ST5, ST6, ST7 and ST8 comprising respective triggered flip-flops, which can be of the type shown in FIG. 2. These T flip-flops receive a jam load control signal SET, a synchronous clock signal CLK, and a power-up enable signal φVCCH, each of which signals is applied in common to all of the counter stages ST0, ST1, ST2, ST3, ST4, ST5, ST6, ST7 and ST8. The counter stages ST0, ST1, ST2, ST3, ST4, ST5, ST6, ST7 and ST8 supply upcount output signals Q0, Q1, Q2, Q3, Q4, Q5, Q6, Q7 and Q8, respectively, each of which output signals is in a ZERO logic state or in a ONE logic state except when being switched between those logic states. Responsive to the jam load control signal SET being in a ONE logic state, the output signals Q0, Q1, Q2, Q3, Q4, Q5, Q6, Q7 and Q8 will be set to the logic states of input signals A0, A1, A2, A3, A4, A5, A6, A7 and A8 applied to the counter stages ST0, ST1, ST2, ST3, ST4, ST5, ST6, ST7 and ST8 from respective low-impedance sources. Responsive to the power-up enable signal φVCCH generated in response to the application of operating potential being in a ONE logic state following the discontinuation of operating potential thereto, the counter stages ST0, ST1, ST2, ST3, ST4, ST5, ST6, ST7 and ST8 are reset, to place their respective upcount output signals Q0, Q1, Q2, Q3, Q4, Q5, Q6, Q7 and Q8 into respective ZERO logic states.

The respective output signal Q0 of the zeroeth counter stage ST0 is supplied without delay to the first counter stage ST1 as a zeroeth carry signal CAR0. A NAND gate 11 NANDs the zeroeth carry signal CAR0 supplied to the first counter stage ST1 and the respective output signal Q1 of the counter stage ST1, and a logic inverter 12 converts the NAND gate 11 response to an AND response to CAR0 and Q1 supplied without delay to the second counter stage ST2 as a first carry signal CAR1. A NAND gate 13 NANDs the first carry signal CAR1 and the respective output signal Q2 of the second counter stage ST2, and a logic inverter 14 converts the NAND gate 13 response to an AND response to CAR1 and Q2 supplied without delay to the third counter stage ST3 as a second carry signal CAR2. A NAND gate 15 NANDs the second carry signal CAR2 and the respective output signal Q3 of the third counter stage ST3, and a logic inverter 16 converts the NAND gate 15 response to an AND response to CAR2 and Q3 supplied without delay to the fourth counter stage ST4 as a third carry signal CAR3. A NAND gate 17 NANDs the third carry signal CAR3 and the respective output signal Q4 of the fourth counter stage ST4, and a logic inverter 18 converts the NAND gate 17 response to an AND response to CAR3 and Q4 supplied without delay to the fifth counter stage ST5 as a fourth carry signal CAR4. A NAND gate 19 NANDs the fourth carry signal CAR4 and the respective output signal Q5 of the fifth counter stage ST5, and a logic inverter 20 converts the NAND gate 19 response to an AND response to CAR4 and Q5 supplied without delay to the sixth counter stage ST6 as a fifth carry signal CAR5. A NAND gate 21 NANDs the fifth carry signal CAR5 and the respective output signal Q6 of the sixth counter stage ST6, and a logic inverter 22 converts the NAND gate 21 response to an AND response to CAR5 and Q6 supplied without delay to the seventh counter stage ST7 as a sixth carry signal CAR6. A NAND gate 23 NANDs the sixth carry signal CAR6 and the respective output signal Q7 of the seventh counter stage ST7, and a logic inverter 24 converts the NAND gate 23 response to an AND response to CAR6 and Q7 supplied without delay to the eighth counter stage ST8 as a seventh carry signal CAR7. Assuming delay through a NAND gate and delay through a logic inverter each to have a value D, there is a transmission delay of 2D per counter stage in the ripple carry propagation described in this paragraph.

Figure 2:
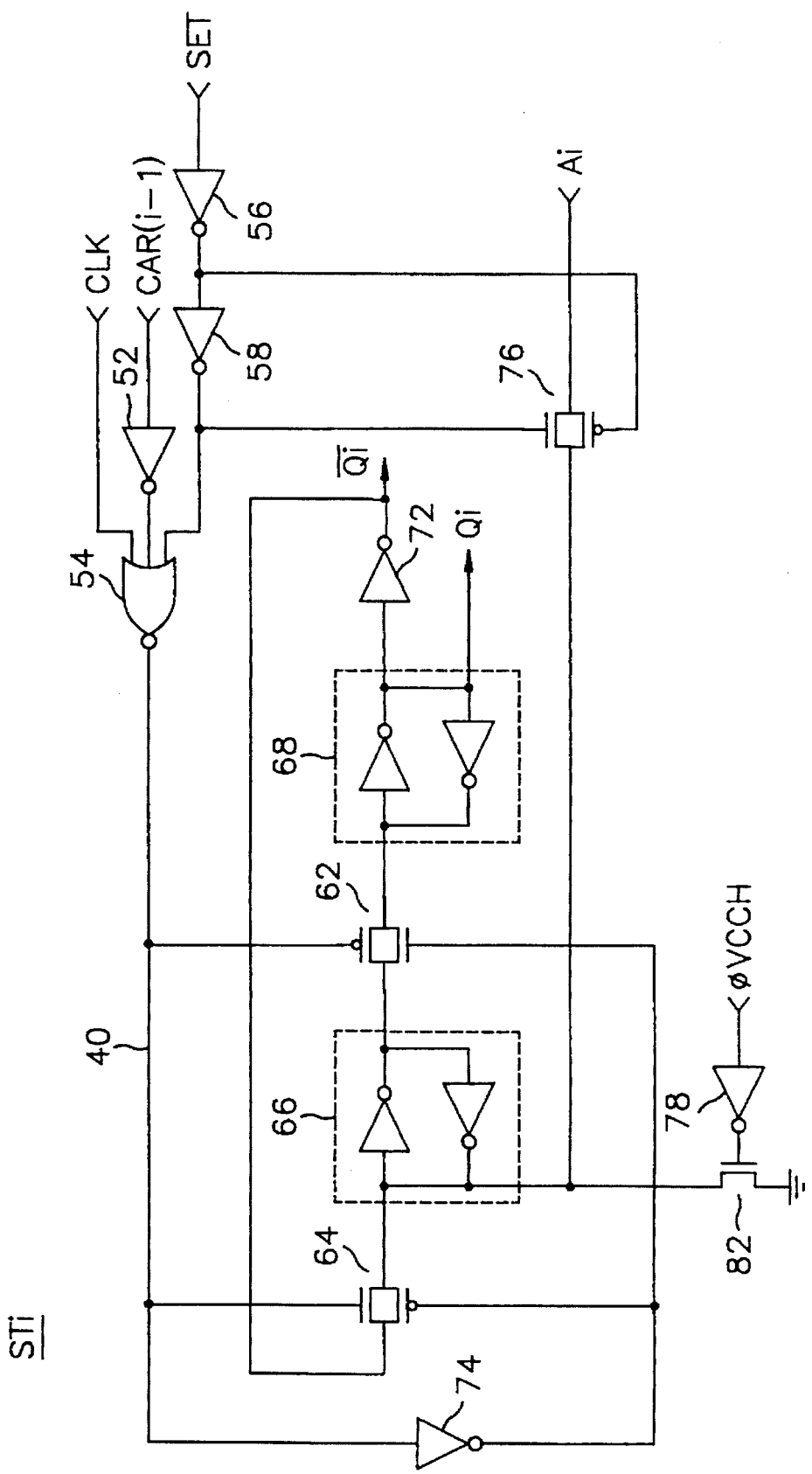
FIG. 2 is a detailed schematic diagram of a prior-art triggered flip-flop circuit as can be used in each stage of the FIG. 1 synchronous binary counter.

FIG. 2 shows a representative structure STi for each of the counter stages ST0, ST1, ST2, ST3, ST4, ST5, ST6, ST7 and ST8. If a jam load control signal SET that is a logic "high" is supplied to cascaded logic inverters 56 and 58, their inverted and non-inverted responses to the "high" SET signal render a transmission gate 62 transmissive to supply a bit $A_i$ of a jam load input signal to a latch circuit 66 for temporary storage therein. The logic "high" response of the logic inverter 58 to the "high" SET signal is applied to a NOR gate 54 as an input signal thereto, conditioning the output of the NOR gate 54 to hold the node 40 at a logic "low". The logic "low" on the node 40 is applied to a logic inverter 74 as an input signal thereto, conditioning its output signal to be a logic "high". This logic "high" and the logic "low" at the node 40 condition a transmission gate 64 to be non-transmissive and condition a transmission gate 62 to be transmissive to supply to a latch circuit 68 the complement $\overline{A}_i$ of bit $A_i$ temporarily stored in the latch circuit 66, thus to cause the temporarily stored bit $A_i$ to appear as the output signal $Q_i$, completing the jam loading. By way of example, in a dynamic random access memory (DRAM) using the synchronous binary counter for address scanning, the jam load input signal can be an initial address. After the jam load input signal is latched, the SET signal is returned to a logic "low" condition, so the inverted and non-inverted responses of the cascaded logic inverters 56 and 58 to the logic "low" condition of the SET signal render the transmission gate 62 non-conductive.

The counter stage STi is arranged to receive a carry signal CAR(i–1), providing that i is between one and eight, inclusive. When the carry signal CAR(i–1) is logic "low", the complement of that signal is supplied by a logic inverter 52 to the NOR gate 54 to hold the node 40 at a logic "low". The logic "low" on the node 40 causes the logic inverter 74 output signal to be a logic "high". This logic "high" and the logic "low" at the node 40 condition a transmission gate 64 to be non-transmissive and condition a transmission gate 62 to be transmissive. Since the transmission gate 64 is non-transmissive, the bit $A_i$ temporarily stored in the latch circuit 66 remains unchanged. When the carry signal CAR(i–1) is logic "high", the complement of that signal is supplied by a logic inverter 52 to the NOR gate 54, which does not respond to that logic "low". The response of the NOR gate 54 is conditioned by the clock signal CLK, presuming the SET signal to be logic "low". If the clock signal CLK is set to logic "low", a logic inverter 72 responsive to the output signal $Q_i$ supplies the complement $\overline{A}_i$ of the bit $A_i$ appearing as the output signal $Q_i$. Node 40 is pulled up to logic "high" by the NOR gate 54, which causes the logic inverter 74 output signal to be a logic "low". This logic "low" and the logic "high" at the node 40 condition the transmission gate 62 to be non-transmissive and condition the transmission gate 64 to be transmissive to invert the bit $A_i$ temporarily stored in the latch circuit 66 to the complement $\overline{A}_i$ supplied from the comparatively low source impedance of the logic inverter 72. When the clock signal CLK returns to its logic "high" state, the NOR gate 54 is thereby conditioned to hold the node 40 at a logic "low". The logic "low" on the node 40 causes the logic inverter 74 output signal to be a logic "high". This logic "high" and the logic "low" at the node 40 condition the transmission gate 64 to be non-transmissive and condition the transmission gate 62 to be transmissive to supply to the latch circuit 68 the complement $\bar{A}_i$ of the bit $\bar{A}_i$ temporarily stored in the latch circuit 66, thus to cause the temporarily stored bit $\bar{A}_i$ to appear as the upcount output signal $Q_i$.

Downcount output signal $\bar{Q}_i$, the complement of the upcount output signal $Q_i$, can be made available from the output of the logic inverter 72.

Figure 3A:
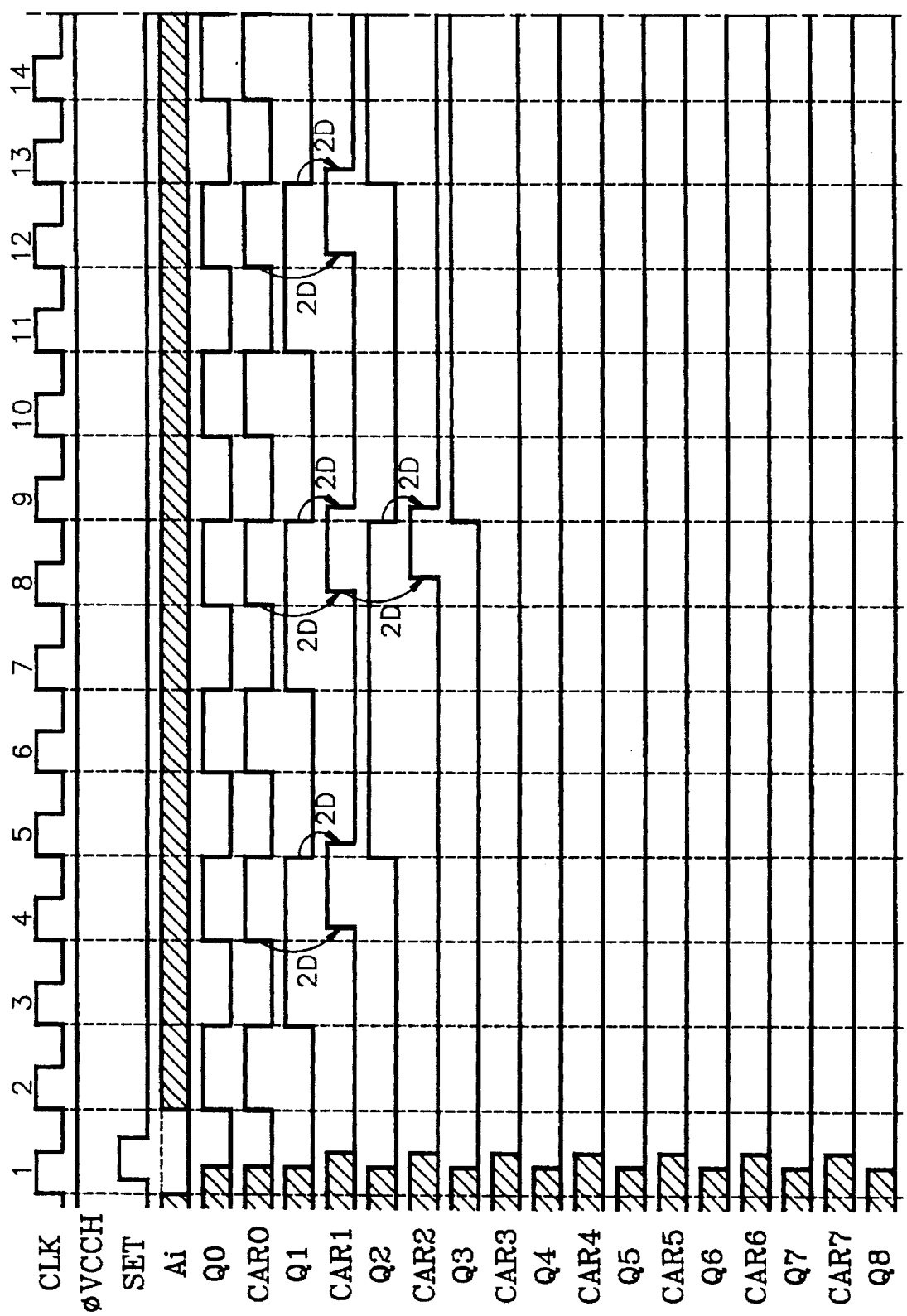
FIGS. 3A, 3B and 3C are timing charts descriptive of the operation of the FIG. 1 synchronous binary counter, which timing charts can be combined to form a FIG. 3.
Figure 3B:
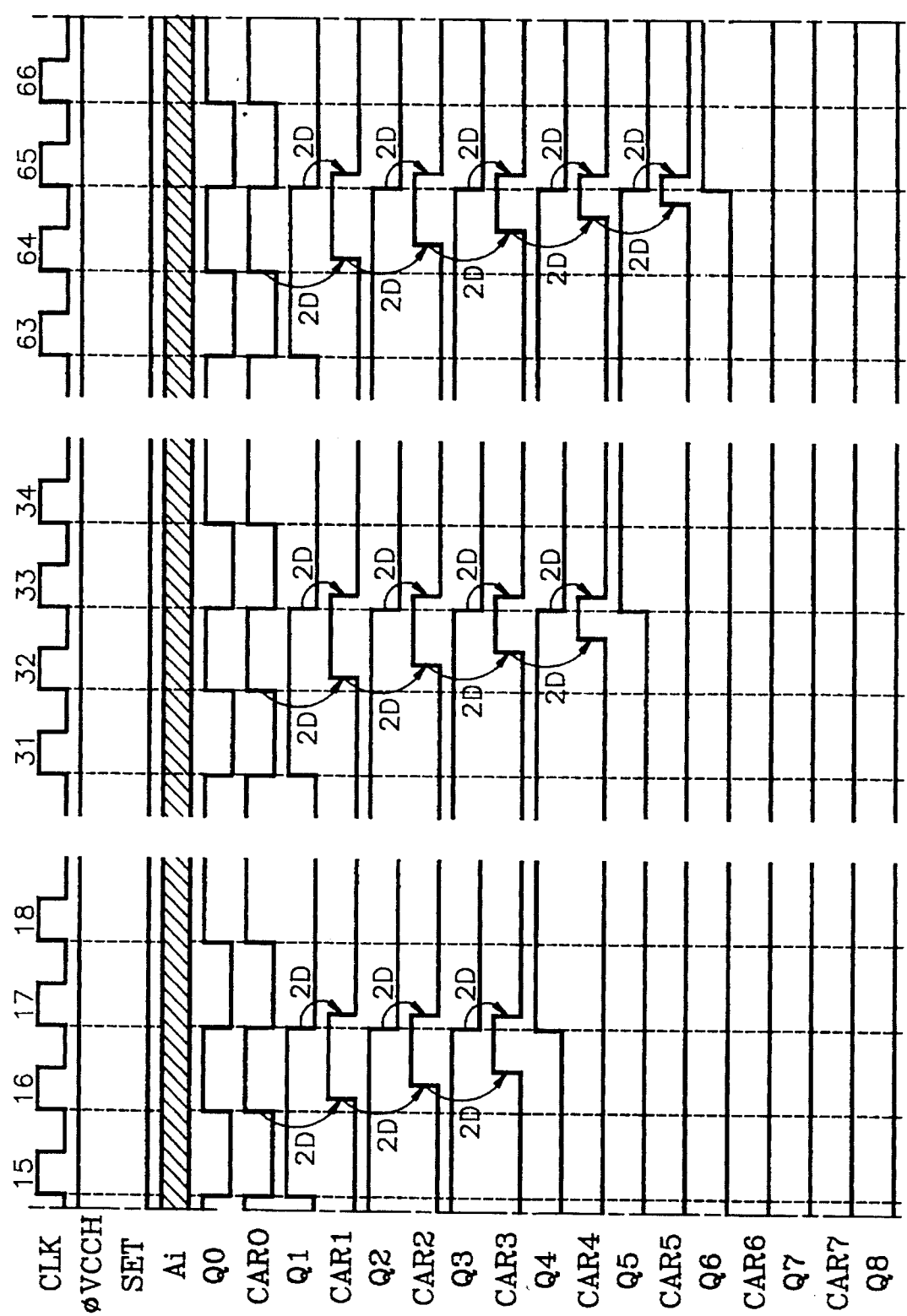
Figure 3C:
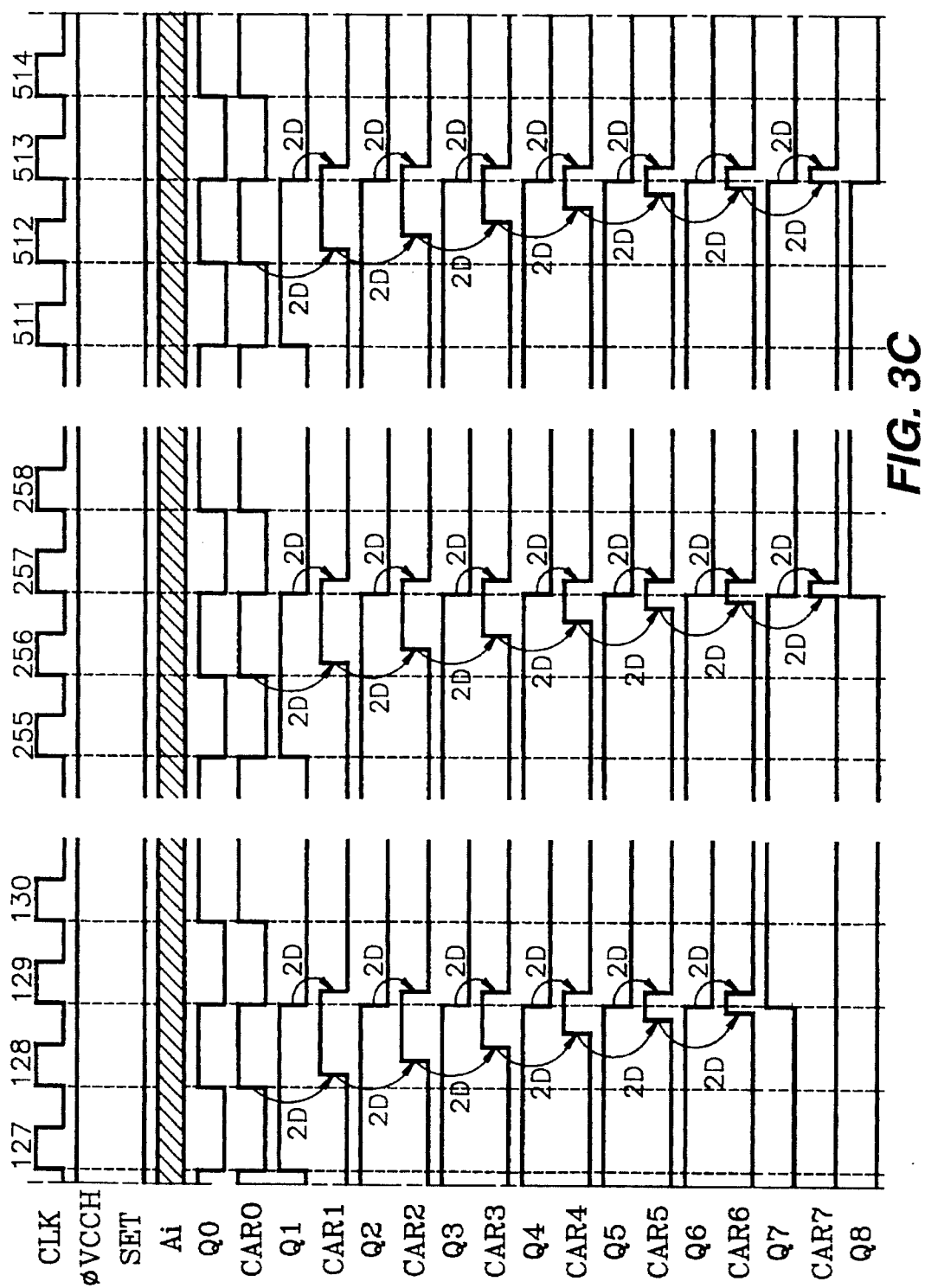

FIGS. 3A, 3B and 3C depict the transmission delay of 2D per counter stage in the ripple carry propagation of the FIG. 1 synchronous binary counter. A zeroeth carry signal CAR0 generated by the zeroeth counter stage ST0 as its output signal Q0 is supplied without delay to the first counter stage ST1 and is also supplied without delay as a first input signal of the NAND gate 11, which NAND gate 11 receives Q1 as a second input signal thereof. The logic inverter 12 supplies a logic inverter response to the NAND gate 11 response, which logic inverter 12 response is supplied without delay to the second counter stage ST2 as a first carry signal CAR1. Assuming delay through a NAND gate and delay through a logic inverter each to have a value D, the NAND gate 11 and the logic inverter 12 delay the first carry signal CAR1 by 2D respective to the zeroeth carry signal CAR0 occurring when Q1 is a ONE. FIG. 3A depicts this occurring in the time slots occupied by the CLK pulses 4, 8 and 12; FIG. 3B depicts this occurring in the time slots occupied by the CLK pulses 16, 32 and 64; and FIG. 3C depicts this occurring in the time slot occupied by the CLK pulses 128, 256 and 512. This 2D delay of the first carry signal CAR1 occurs in the time slot occupied by every fourth CLK pulse.

The first carry signal CAR1 and the output signal Q2 of the flip-flop ST2 are respectively applied without delay to the NAND gate 13 as first and second input signals thereto. The logic inverter 14 supplies a logic inverter response to the NAND gate 13 response, which logic inverter 14 response is supplied without delay to the third. Canter stage ST3 as the second carry signal CAR2. Again assuming delay through a NAND gate and delay through a logic inverter each to have a value D, the second carry signal CAR2 is delayed 2D respective to the first carry signal CAR1 occurring when Q2 is a ONE. Since the first carry signal CAR1 is delayed 2D respective to the zeroeth carry signal CAR0 occurring when Q1 is a ONE, the rising edge of the second carry signal CAR2 is delayed 4D respective to the zeroeth carry signal CAR0 occurring when Q1 and Q2 are each a ONE. FIG. 3A depicts this occurring in the time slot occupied by the CLK pulse 8; FIG. 3B depicts this occurring in the time slots occupied by the CLK pulses 16, 32 and 64; and FIG. 3C depicts this occurring in the time slots occupied by the CLK pulses 128, 256 and 512. This 4D delay of the rising edge of the second carry signal CAR2 occurs in the time slot occupied by every eighth CLK pulse.

The falling edge of the second carry signal CAR2, which occurs in each time slot after one of the time slots occupied by every eighth CLK pulse, results from the falling of the output signal Q2 as delayed 2D by the NAND gate 13 and the logic inverter 14. The 4D delay of the rising edge of the second carry signal CAR2 that occurs in the time slot occupied by every eighth CLK pulse and the 2D delay of the falling edge of the second carry signal CAR2 that occurs in the next time slot narrows the "high" pulsewidth of the second carry signal CAR2 2D respective to the "high" pulsewidth of the zeroeth carry signal CAR0 or of the first carry signal CAR1.

The second carry signal CAR2 and the output signal Q3 of the flip-flop ST3 are respectively applied without delay to the NAND gate 15 as first and second input signals thereto. The logic inverter 16 supplies a logic inverter response to the NAND gate 15 response, which logic inverter 16 response is supplied without delay to the fourth counter stage ST4 as the third carry signal CAR3, the rising edge of which is delayed 2D respective to the rising edge of the second carry signal CAR2 occurring when Q3 is a ONE. Since the rising edge of the second carry signal CAR2 is delayed 4D respective to the rising edge of the zeroeth carry signal CAR0 occurring when Q1 and Q2 are each a ONE, the rising edge of the third carry signal CAR3 is delayed 6D respective to the zeroeth carry signal CAR0 occurring when Q1, Q2 and Q3 are each a ONE. FIG. 3B depicts this occurring in the time slots occupied by the CLK pulses 16, 32 and 64; and FIG. 3C depicts this occurring in the time slots occupied by the CLK pulses 128, 256 and 512. This 6D delay of the rising edge of the third carry signal CAR3 occurs in the time slot occupied by every sixteenth CLK pulse.

The falling edge of the third carry signal CAR3, which occurs in each time slot after one of the time slots occupied by every sixteenth CLK pulse, results from the falling of the output signal Q3 as delayed 2D by the NAND gate 15 and the logic inverter 16. The 4D delay of the rising edge of the third carry signal CAR3 that occurs in the time slot occupied by every sixteenth CLK pulse and the 2D delay of the falling edge of the third carry signal CAR3 that occurs in the next time slot narrows the "high" pulsewidth of the third carry signal CAR3 2D respective to the "high" pulsewidth of the second carry signal CAR2 and 4D respective to the "high" pulsewidth of the zeroeth carry signal CAR0 or of the first carry signal CAR1.

FIG. 3B depicts the rising edge of the fourth carry signal CAR4 being delayed 8D respective to the rising edge of the zeroeth carry signal CAR0 when Q1, Q2, Q3 and Q4 are each a ONE occurring in the time slots occupied by the CLK pulses 32 and 64; and FIG. 3C depicts this occurring in the time slots occupied by the CLK pulses 128, 256 and 512. This 8D delay of the rising edge of the fourth carry signal CAR4 occurs in the time slot occupied by every thirty-second CLK pulse and narrows the "high" pulsewidth of the fourth carry signal CAR4 6D respective to the "high" pulsewidth of the zeroeth carry signal CAR0 or of the first carry signal CAR1.

FIG. 3B depicts the rising edge of the fifth carry signal CAR5 being delayed 10D respective to the rising edge of the zeroeth carry signal CAR0 when Q1, Q2, Q3, Q4 and Q5 are each a ONE occurring in the time slot occupied by the CLK pulse 64; and FIG. 3C depicts this occurring in the time slots occupied by the CLK pulses 128,256 and 512. This 10D delay of the rising edge of the fifth carry signal CAR5 occurs in the time slot occupied by every sixty-fourth CLK pulse and narrows the "high" pulsewidth of the fifth carry signal CAR5 8D respective to the "high" pulsewidth of the zeroeth carry signal CAR0 or of the first carry signal CAR1.

FIG. 3C depicts the rising edge of the sixth carry signal CAR6 being delayed 12D respective to the rising edge of the zeroeth carry signal CAR0 when Q1, Q2, Q3, Q4, Q5 and Q6 are each a ONE occurring in the time slots occupied by the CLK pulses 128,256 and 512. This 12D delay of the rising edge of the sixth carry signal CAR6 occurs in the time slot occupied by every sixty-fourth CLK pulse and narrows the "high" pulsewidth of the sixth carry signal CAR6 10D respective to the "high" pulsewidth of the zeroeth carry signal CAR0 or of the first carry signal CAR1.

FIG. 3C depicts the rising edge of the seventh carry signal CAR7 being delayed 14D respective to the rising edge of the zeroeth carry signal CAR0 when Q1, Q2, Q3, Q4, Q5, Q6 and Q7 are each a ONE occurring in the time slots occupied by the CLK pulses 256 and 512. This 14D delay of the rising edge of the seventh carry signal CAR7 occurs in the time slot occupied by every $128^{th}$ CLK pulse and narrows the "high" pulsewidth of the seventh carry signal CAR7 12D respective to the "high" pulsewidth of the zeroeth carry signal CAR0 or of the first carry signal CAR1.

In the FIG. 1 synchronous binary counter each carry signal is generated by ANDing the output signal of the previous counter stage with the carry signal supplied thereto, the ANDing being done by a respective NAND gate followed by a respective logic inverter. Supposing each counter stage to be as shown in FIG. 2, if the synchronous clock CLK is set to be logic "low" when the carry signal is logic "high" and the reset signal SET is logic "low", the output of the NOR gate 54 is set to logic "high" rendering the transmission gate 64 transmissive to apply the output of the logic inverter 72 to the latch circuit 66, so the latch circuit 66 is toggled from its previous state to the opposite state. When the synchronous clock CLK subsequently goes to logic "high" state rendering the transmission gate 64 non-transmissive and the transmission gate 62 transmissive, the latch circuit 68 is toggled from its previous state to the opposite state, so that Qi changes state. In the NOR gate 54 the transition of a carry signal to logic "high" state should be completed before the trigger-up, or transition from logic "low" to logic "high" of the next synchronous clock CLK pulse. For example, the transition of the carry signal CAR 5 of FIG. 3B to logic "high" state should be completed before the trigger-up, or transition from logic "low" to logic "high" of the $65^{th}$ synchronous clock CLK pulse. The transition of the carry signal from logic "high" to logic "low" should then be completed before the trigger-down, or transition from logic "high" to logic "low" of the next synchronous clock CLK pulse. Continuing the previous example, the transition of the carry signal CAR 5 of FIG. 3B to logic "low" state should be completed before the trigger-down, or transition from logic "high" to logic "low" of the $65^{th}$ synchronous clock CLK pulse. Accordingly, the carry signal transition to logic "high" has a time margin corresponding to one period of the synchronous clock CLK (i.e., the time between the triggers-up of the $64^{th}$ and the $65^{th}$ synchronous clock CLK pulses), but the carry signal transition to logic "low" has a time margin corresponding to only to the pulse width of the synchronous clock CLK (i.e., the "high" pulsewidth of the $65^{th}$ synchronous clock CLK pulse).

Referring to FIG. 3C, the transition of the carry signal CAR7 to logic "high", the time available for toggling the output signal Q8 is reduced by the simultaneous occurrence of the trigger-up of the $257^{th}$ synchronous clock CLK pulse. Therefore, a correct counting operation cannot be maintained.

If the counting operation is carried on with the reset signal SET remaining in its logic "low" state, the output signal of the previous counting stage becomes logic "low" in response to the trigger-up of the $257^{th}$ synchronous clock CLK pulse; and the carry signal transition is completed after the delay time 2D. Therefore, an erroneous carry signal of logic "low" appears during the logic "high" interval of the next synchronous clock CLK pulse.

To generate the output signals Q0, Q1, Q2, Q3, Q4, Q5, Q6, Q7 and Q8 in proper binary count sequence in response to the triggers-up of the synchronous clock CLK pulses, the carry signals CAR0, CAR1, CAR2, CAR3, CAR4, CAR5, CAR6, CAR7 and CAR8 should all have completed their transitions from logic "low" to logic "high" state. The accumulation of carry signal delay during ripple carry shortens the "ready time" during which the toggling of the output signals Q0, Q1, Q2, Q3, Q4, Q5, Q6, Q7 and Q8 can be done in the counter stages ST0, ST1, ST2, ST3, ST4, ST5, ST6, ST7 and ST8.

Figure 4:
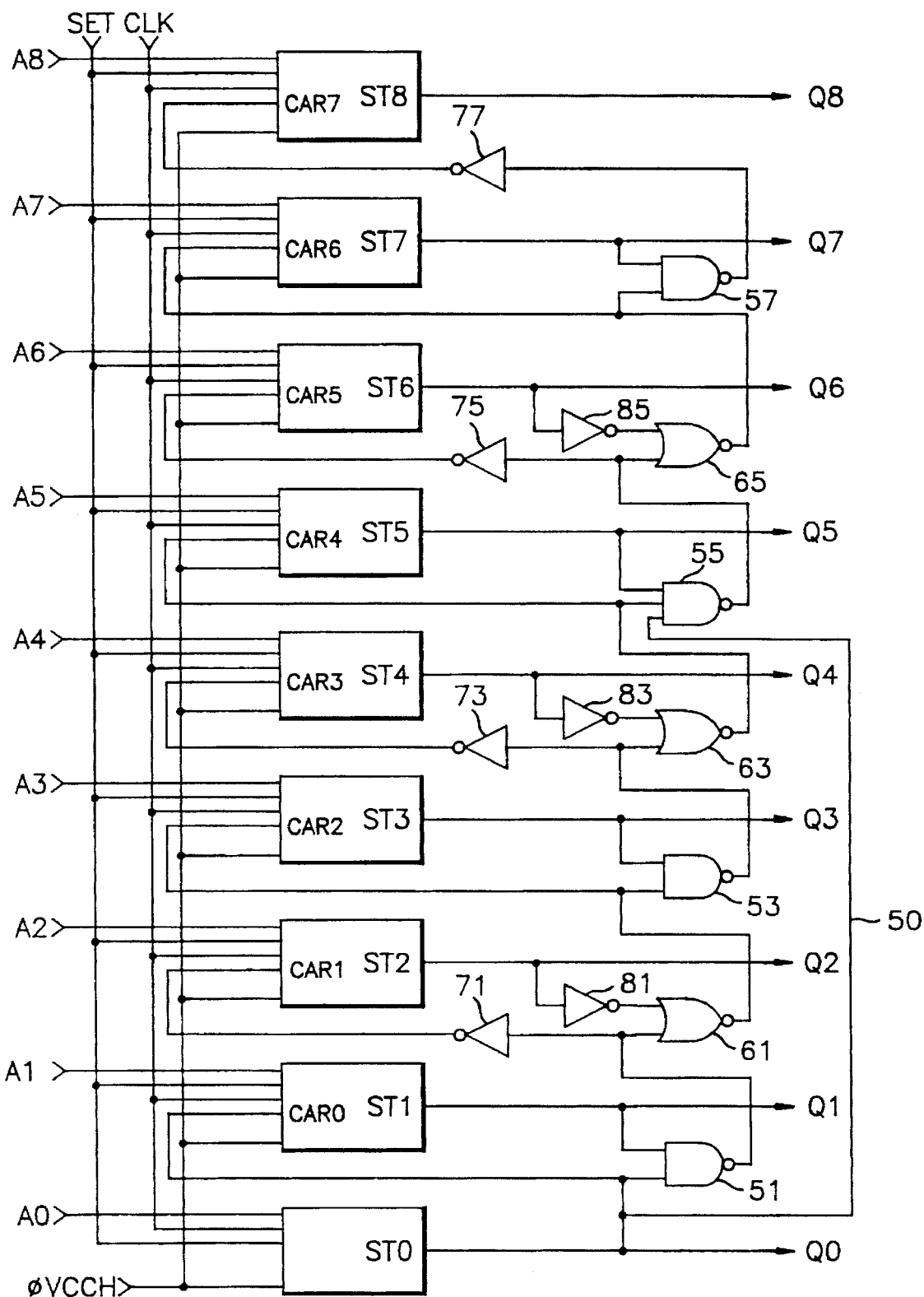
FIG. 4 is a schematic diagram of a synchronous binary counter embodying the invention.

FIG. 4 shows a synchronous binary counter arranged in accordance with the invention for faster carry propagation. The FIG. 4 synchronous binary counter, like that of FIG. 1, includes nine counter stages ST0, ST1, ST2, ST3, ST4, ST5, ST6, ST7 and ST8 comprising respective triggered flip-flops, which can be of the type shown in FIG. 2. These T flip-flops receive a jam load control signal SET, a synchronous clock signal CLK, and a power-up enable signal $\phi$VCCH, each of which signals is applied in common to all of the counter stages ST0, ST1, ST2, ST3, ST4, ST5, ST6, ST7 and ST8. The counter stages ST0, ST1, ST2, ST3, ST4, ST5, ST6, ST7 and ST8 supply upcount output signals Q0, Q1, Q2, Q3, Q4, Q5, Q6, Q7 and Q8, respectively, each of which output signals is in a ZERO logic state or in a ONE logic state except when being switched between those logic states. Responsive to the jam load control signal SET being in a ONE logic state, the output signals Q0, Q1, Q2, Q3, Q4, Q5, Q6, Q7 and Q8 will be set to the logic states of input signals A0, A 1, A2, A3, A4, A5, A6, A7, and A8 applied to the counter stages ST0, ST1, ST2, ST3, ST4, ST5, ST6, ST7 and ST8 from respective low-impedance sources. Responsive to the power-up enable signal $\phi$VCCH generated in response to the application of operating potential being in a ONE logic state following the discontinuation of operating potential thereto, the counter stages ST0, ST1, ST2, ST3, ST4, ST5, ST6, ST7 and ST8 are reset, to place their respective output signals Q0, Q1, Q2, Q3, Q4, Q5, Q6, Q7 and Q8 into respective ZERO logic states.

A zeroeth carry signal CAR0 generated by a zeroeth counter stage ST0 is supplied without delay to the first counter stage ST1 and is also supplied without delay as an input signal of a first NAND gate 51, which first NAND gate 51 receives Q1 as a another input signal thereof. A first logic inverter 71 supplies a first logic inverter response to the first NAND gate 51 response, which first logic inverter response is supplied without delay to the second counter stage ST2 as a first carry signal CAR1, just as in the prior-art FIG. 1 synchronous binary counter. Accordingly, assuming delay through a NAND gate and delay through a logic inverter each to have a value D, the first carry signal CAR1 is delayed 2D respective to the zeroeth carry signal CAR0 occurring when Q1 is a ONE, just as in the FIG. 1 prior-ann synchronous binary counter. Referring to the timing charts of FIGS. 5A, 5B and 5C for the FIG. 4 synchronous binary counter, one will note that the relationship between the zeroeth carry signal CAR0 and the first carry signal CAR1 are the same as shown in the timing charts of FIGS. 3A, 3B and 3C for the FIG. 1 synchronous binary counter.

A second carry signal CAR2 to be supplied without delay to the third counter stage ST3 is generated by a first NOR gate 61 in response to the first NAND gate 51 response and to second logic inverter response supplied by a second logic inverter 81 in response to Q2. Assuming delay through a NOR gate also to have a value D, the second carry signal CAR2 is generated by the first NOR gate 61 with delay D from the time when its input signals are both ZEROs—that is, when Q2 is a ONE and the first NAND gate 51 response is a ZERO responsive to Q1 being a ONE and to CAR0 being a ONE. The rising edge of the second carry signal CAR2 generated by the first NOR gate 61 is delayed by D from the falling edge of the first NAND gate 51 response, already delayed D from the rising edge of CAR0. That is, the rising edge of the second carry signal CAR2 is delayed only 2D from the rising edge of CAR0. In a local look-ahead carry procedure, the FIG. 1 counter the NOR gate 61 looks ahead to determine what the first carry signal CAR1 will be, before its generation by the logic inverter 71 for application to the counter stage ST2, following which the NOR gate 61 generates an earlier second carry signal CAR2 than in the FIG. 4 counter.

The falling edge of the second carry signal CAR2 generated by the first NOR gate 61 can be delayed by D from the rising edge of the first NAND gate 51 response, already delayed D from the falling edge of CAR0. Or, alternatively, the falling edge of the second carry signal CAR2 generated by the first NOR gate 61 can be delayed by D from the rising edge of the second logic inverter 81 response to Q2 going low, already delayed by D from the rising edge of the synchronous clock CLK pulse next after each fourth synchronous clock CLK pulse. Whichever of these two race conditions first obtains, the falling edge of the second carry signal CAR2 is delayed 2D from the rising edge of the synchronous clock CLK pulse next after each fourth synchronous clock CLK pulse.

Figure 5A:
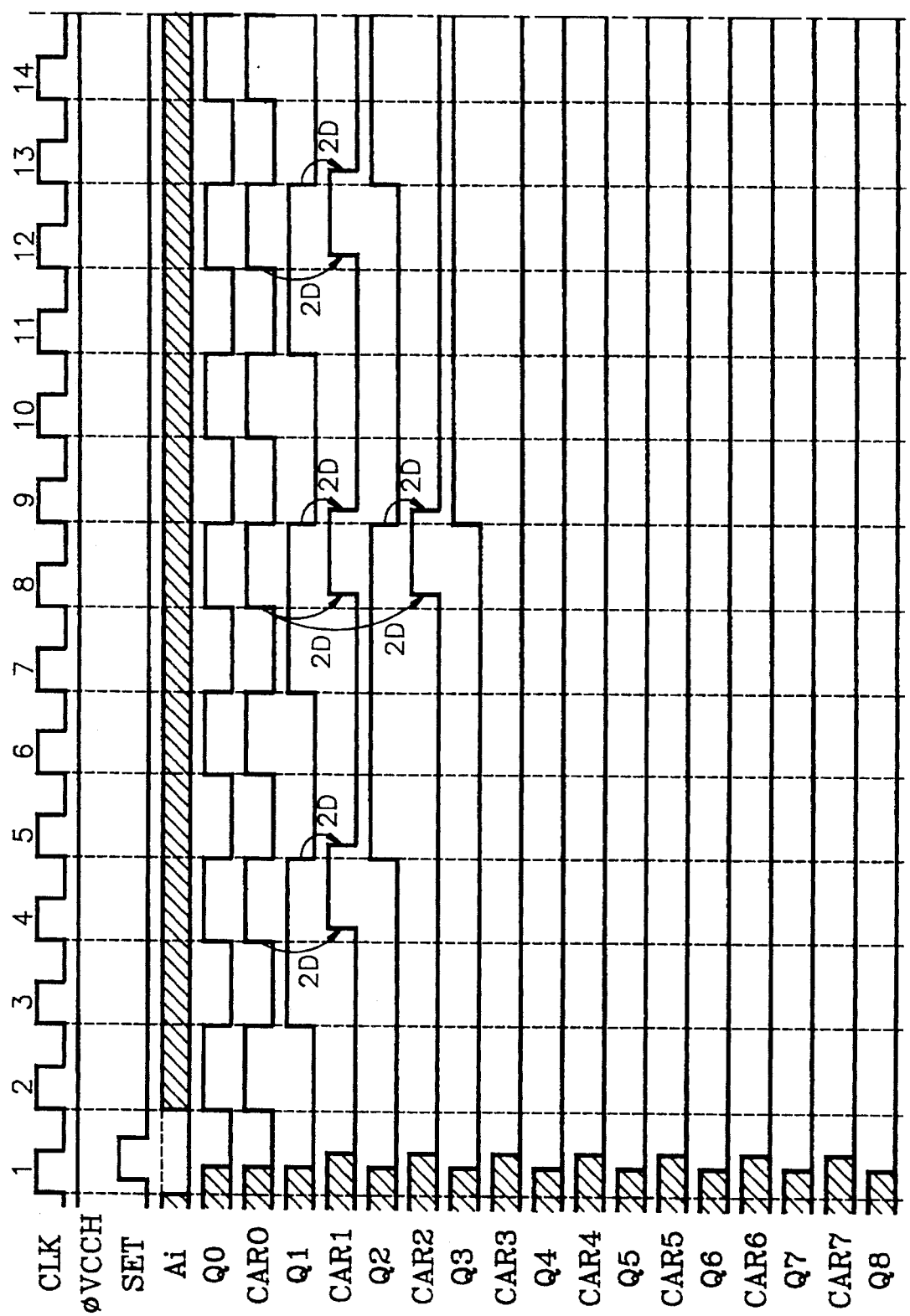
FIGS. 5A, 5B and 5C are timing charts descriptive of the operation of the FIG. 4 synchronous binary counter, which timing charts can be combined to form a FIG. 5. (separately shown as an assembly drawing).
Figure 5B:
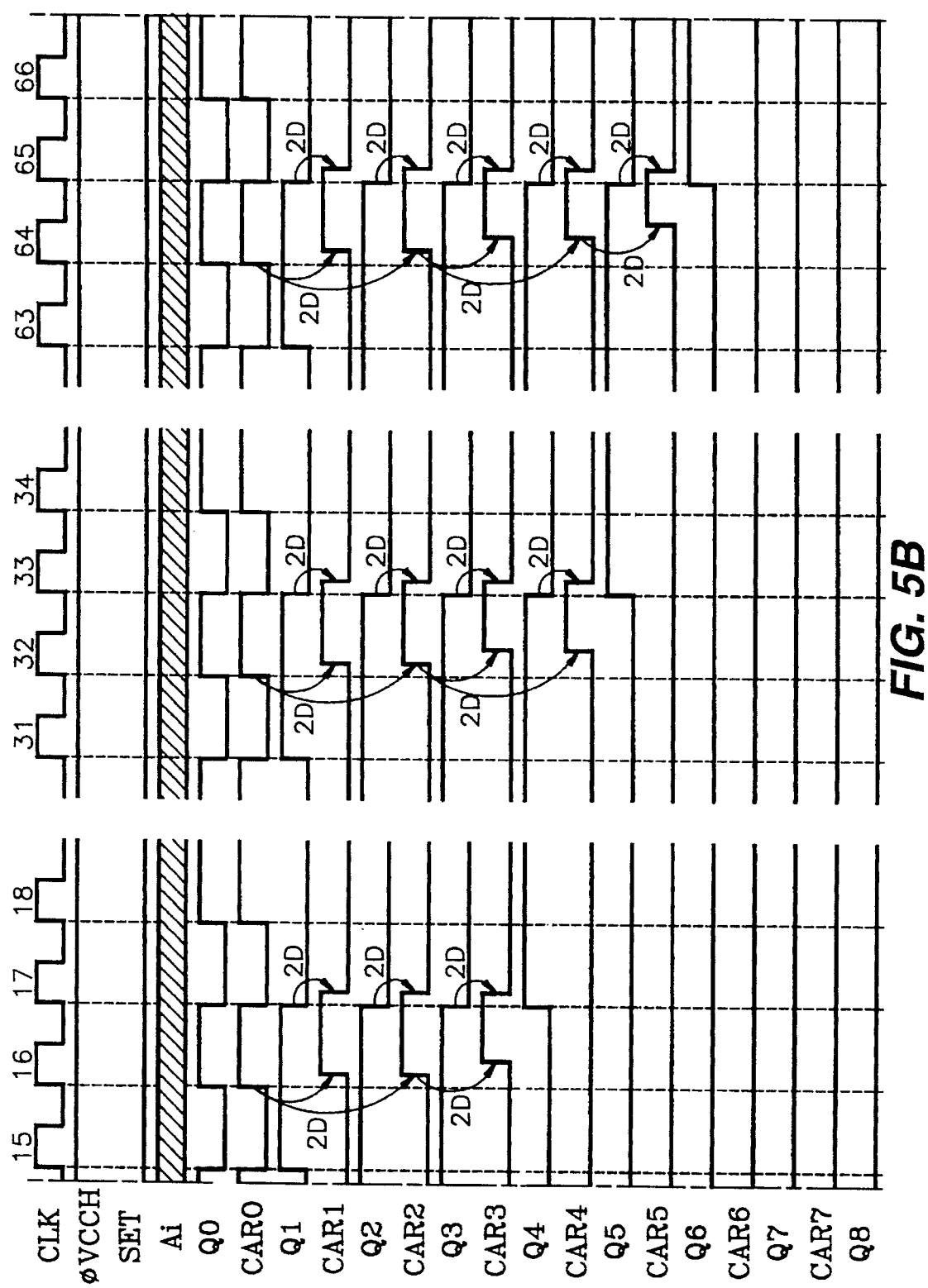
Figure 5C:
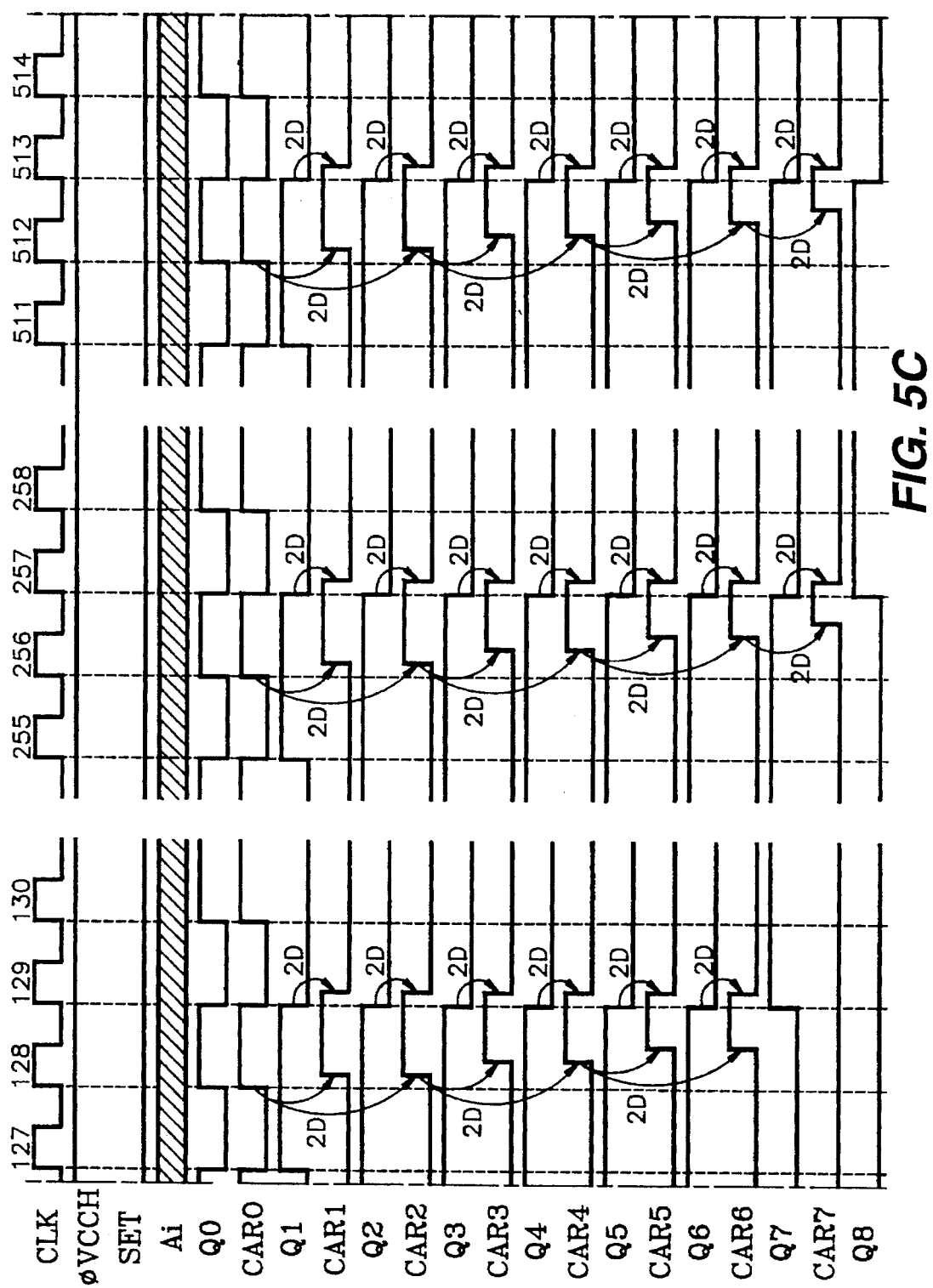

Referring to the tinting charts of FIGS. 5A, 5B and 5C for the FIG. 4 synchronous binary counter, the reader can note that the relationship between the first carry signal CAR1 and the second carry signal CAR2 differs from that shown in the timing charts of FIGS. 3A, 3B and 3C for the FIG. 1 synchronous binary counter. The reader's attention is directed to the $8^{th}$, $16^{th}$, $32^{nd}$, $64^{th}$, $128^{th}$, $256^{th}$ and $512^{th}$ synchronous clock CLK pulses, particularly the $8^{th}$. The rising edge of second carry signal CAR2 is generated 2D earlier in the FIG. 4 synchronous binary counter than in the FIG. 1 prior-art synchronous binary counter. So, the second carry signal CAR2 pulses are longer by 2D in the FIG. 4 counter than in the FIG. 1 counter.

The second carry signal CAR2 is supplied without delay to the third counter stage ST3 and is also supplied without delay as an input signal of a second NAND gate 53, which second NAND gate 53 receives Q3 as another input signal thereof. A third logic inverter 73 supplies a third logic inverter response to the second NAND gate 53 response, which third logic inverter response is supplied without delay to the fourth counter stage ST4 as a third carry signal CAR3. The derivation of the third carry signal CAR3 from CAR2 and Q3 is similar to that in the FIG. 1 prior-art synchronous binary counter, with the rising edge of CAR3 being delayed 2D from the rising edge of CAR2. However, since the rising edge of CAR2 is delayed 2D from the rising edge of CAR0 in the FIG. 4 synchronous binary counter rather than being delayed 4D as in the FIG. 1 prior-art synchronous binary counter, the rising edge of CAR3 is delayed only 4D from the rising edge of CAR0 in the FIG. 4 synchronous binary counter rather than being delayed 6D as in the FIG. 1 prior-art synchronous binary counter. The falling edge of the third carry signal CAR3, which occurs in each time slot after one of the time slots occupied by every sixteenth CLK pulse, results from the falling of the output signal Q3 as delayed 2D by the NAND gate 53 and the logic inverter 73.

Referring to the timing charts of FIGS. 5B and 5C for the FIG. 4 synchronous binary counter, the reader can note that the relationship between the third carry signal CAR3 and the first carry signal CAR1 differs from that shown in the timing charts of FIGS. 3B and 3C for the FIG. 1 synchronous binary counter owing to the difference in the relationship between the first carry signal CAR1 and the second carry signal CAR2, despite the relationship between the second carry signal CAR2 and the third carry signal CAR3 being similar in the FIG. 1 and FIG. 4 counters. The reader's attention is directed to the $16^{th}$, $32^{nd}$, $64^{th}$, $128^{th}$, $256^{th}$ and $512^{th}$ synchronous clock CLK pulses, particularly the $16^{th}$. The rising edge of the third carry signal CAR3 is generated 2D earlier in the FIG. 4 synchronous binary counter than in the FIG. 1 prior-art synchronous binary counter. Since the falling edges of the third carry signal CAR3 are generated at the same time in the FIG. 1 and FIG. 4 synchronous binary counters, the third carry signal CAR3 pulses are longer by 2D in the FIG. 4 counter than in the FIG. 1 counter.

A fourth carry signal CAR4 to be supplied without delay to the fifth counter stage ST5 is generated by a second NOR gate 63 in response to the second NAND gate 53 response and to fourth logic inverter response supplied by a fourth logic inverter 83 in response to Q4. The fourth carry signal CAR4 is generated by the second NOR gate 63 with delay D from the time when its input signals both are ZEROs— that is, when Q4 is a ONE and the second NAND gate 53 response is a ZERO responsive to Q3 being a ONE and to CAR2 being a ONE. The rising edge of CAR4 generated by the second NOR gate 63 is delayed by D from the falling edge of the second NAND gate 53 response, already delayed D from the rising edge of CAR2. That is, the rising edge of CAR4 is delayed only 2D from the rising edge of CAR2. Since the rising edge of CAR2 is delayed only 2D from the rising edge of CAR0, the rising edge of CAR4 is delayed only 4D from the rising edge of CAR0. The falling edge of the fourth carry signal CAR4 generated by the second NOR gate 63 is delayed by D from the rising edge of the fourth logic inverter 83 response to Q4 going low at the rising edge of each synchronous clock CLK pulse next after a $32^{nd}$ one.

Referring to the timing charts of FIGS. 5B and 5C for the FIG. 4 synchronous binary counter, the reader can note that the relationship between the fourth carry signal CAR4 and the third carry signal CAR3 differs from that shown in the timing charts of FIGS. 3B and 3C for the FIG. 1 synchronous binary counter. This difference results from a local look-ahead procedure in the FIG. 1 counter in which the NOR gate 63 looks ahead to determine what the third carry signal CAR3 will be, before its generation by the logic inverter 73 for application to the counter stage ST4. The reader's attention is directed to the $32^{nd}$, $64^{th}$, $128^{th}$, $256^{th}$ and $512^{th}$ synchronous clock CLK pulses, particularly the $32^{nd}$. The rising edge of the fourth carry signal CAR4 is generated 4D earlier in the FIG. 4 synchronous binary counter than in the FIG. 1 prior-an synchronous binary counter. Since the falling edges of the fourth carry signal CAR4 are generated at the same time in the FIG. 1 and FIG. 4 synchronous binary counters, the fourth carry signal CAR4 pulses are longer by 4D in the FIG. 4 counter than in the FIG. 1 counter.

The fourth carry signal CAR4 is supplied without delay to the fifth counter stage ST5 and is also supplied without delay as an input signal of a third NAND gate 55, which third NAND gate 55 receives Q0 and Q5 as other input signals thereof. A fifth logic inverter 75 supplies a fifth logic inverter response to the third NAND gate 55 response, which fifth logic inverter response is supplied without delay to the sixth counter stage ST6 as a fifth carry signal CAR5.

Referring to the timing charts of FIGS. 5B and 5C for the FIG. 4 synchronous binary counter, the reader can note that the rising edges of the fifth carry signal CAR5 are delayed 6D from the rising edges of the zeroeth carry signal CAR0, rather than 10D as shown in the timing charts of FIGS. 3B and 3C for the FIG. 1 synchronous binary counter. The reader's attention is directed to the $64^{th}$, $128^{th}$, $256^{th}$ and $512^{th}$ synchronous clock CLK pulses, particularly the $64^{th}$.

The rising edge of the fifth carry signal CAR5 is generated 4D earlier in the FIG. 4 synchronous binary counter than in the FIG. 1 prior-art synchronous binary counter. Since the falling edges of the fifth carry signal CAR5 are generated at the same time in the FIG. 1 and FIG. 4 synchronous binary counters, the fifth carry signal CAR5 pulses are longer by 4D in the FIG. 4 counter than in the FIG. 1 counter.

A sixth carry signal CAR6 to be supplied without delay to the seventh counter stage ST7 is generated by a third NOR gate 65 in response to the third NAND gate 55 response and to sixth logic inverter response supplied by a sixth logic inverter 85 in response to Q6. The sixth carry signal CAR6 is generated by third NOR gate 65 with delay D from the time when its input signals both are ZEROs—that is, when Q6 is a ONE and the third NAND gate 55 response is a ZERO responsive to Q5 being a ONE and to CAR4 being a ONE. The rising edge of CAR6 generated by the third NOR gate 65 is delayed by D from the falling edge of the second NAND gate 53 response, already delayed D from the rising edge of CAR4. That is, the rising edge of CAR6 is delayed only 2D from the rising edge of CAR4. Since the rising edge of CAR4 is delayed only 2D from the rising edge of CAR2 and the rising edge of CAR2 is delayed only 2D from the rising edge of CAR0, the rising edge of CAR6 is delayed only 6D from the rising edge of CAR0. The falling edge of the sixth carry signal CAR4 generated by the third NOR gate 65 is delayed by D from the rising edge of the sixth logic inverter 85 response to Q6 going low at the rising edge of each synchronous clock CLK pulse next after a $64^{th}$ one.

Referring to the timing charts of FIG. 5C for the FIG. 4 synchronous binary counter, the reader can note that the relationship between the sixth carry signal CAR6 and the fifth carry signal CAR5 differs from that shown in the timing charts of FIG. 3C for the FIG. 1 synchronous binary counter. This difference results from a local look-ahead procedure in the FIG. 1 counter in which the NOR gate 65 looks ahead to determine what the fifth CAR5 signal CAR5 will be, before its generation by the logic inverter 75 for application to the counter stage ST6. The reader's attention is directed to the $128^{th}$, $256^{th}$ and $512^{th}$ synchronous clock CLK pulses, particularly the $128^{th}$. The rising edge of the sixth carry signal CAR6 is generated 6D earlier in the FIG. 4 synchronous binary counter than in the FIG. 1 prior-art synchronous binary counter. Since the falling edges of the sixth carry signal CAR6 are generated at the same time in the FIG. 1 and FIG. 4 synchronous binary counters, the sixth carry signal CAR6 pulses are longer by 6D in the FIG. 4 counter than in the FIG. 1 counter.

The sixth carry signal CAR6 is supplied without delay to the seventh counter stage ST7 and is also supplied without delay as an input signal of a fourth NAND gate 57, which fourth NAND gate 57 receives Q7 as another input signal thereof. A seventh logic inverter 77 supplies a seventh logic inverter response to the fourth NAND gate 57 response, which seventh logic inverter response is supplied without delay to the eighth counter stage ST8 as a seventh carry signal CAR7.

Referring to the timing charts of FIG. 5C for the FIG. 4 synchronous binary counter, the reader can note that the rising edges of the seventh carry signal CAR7 are delayed 8D from the rising edges of the zeroeth carry signal CAR0, rather than 14D as shown in the timing charts of FIG. 3C for the FIG. 1 synchronous binary counter. The reader's attention is directed to the $256^{th}$ and $512^{th}$ synchronous clock CLK pulses. The rising edge of the seventh carry signal CAR7 is generated 6D earlier in the FIG. 4 synchronous binary counter than in the FIG. 1 prior-art synchronous binary counter. Since the falling edges of the seventh carry signal CAR7 are generated at the same time in the FIG. 1 and FIG. 4 synchronous binary counters, the seventh carry signal CAR7 pulses are longer by 6D in the FIG. 4 counter than in the FIG. 1 counter.

The transition of the carry signal CAR7 to logic "high" being 6D earlier in time allows more than enough time for the output signal Q8 of the counter stage ST8 to toggle before the trigger-up of the $257^{th}$ synchronous clock CLK pulse. Therefore, a correct counting operation can be maintained.

If desired, further counting stages can be used for the synchronous clock CLK pulse rate shown. Or the synchronous clock CLK pulse rate can be increased somewhat. The modified ripple carry generation scheme that has been described has general application to binary counters that have at least two successive counter stages, the earlier receiving a carry input and the later supplying a carry output. The counter stages of the binary counter can be of designs different from that of FIG. 2, with somewhat different triggering circuitry, without affecting the efficacy of the modified ripple carry generation scheme of the invention, as will be clear to one skilled in the art and acquainted with this specification and the accompanying drawing. The invention is not directly concerned with the specific means for causing flip-flops within the counter stages each to switch its respective output signal from the one of said ZERO and ONE logic states it was previously in to the other of said ZERO and ONE logic states; these means can take a variety of forms other than those specifically illustrated in the drawing and described in this specification, as known to those skilled in the art. The counter stages may be of a type that does not include triggered flip-flops and can each be of in the type constructed from a digital half-adder or exclusive-OR gate, for example.

When the counter stages ST0, ST1, ST2, ST3, ST4, ST5, ST6, ST7 and ST8 each have the structure STi shown in FIG. 2 the invention permits reductions in the counter hardware and a slight reduction in the carrier propagation time to a final counter stage following a penultimate counter stage using a NAND gate for the generation of its carry out (e.g., the final counter stage ST8 following a penultimate counter stage ST7 using a NAND gate for the generation of its carry out in the FIG. 4 binary synchronous counter). In the FIG. 1 synchronous binary counter the logic inverters 12, 14, 16, 18, 20, 22 and 24 had to supply output signals to the NAND gates 11, 13, 15, 17, 19, 21 and 23 in the carry generation circuitry external to the counter stages ST0, ST1, ST2, ST3, ST4, ST5, ST6, ST7 and ST8. In the FIG. 4 synchronous binary counter, however, the logic inverters 71, 73, 75 and 77 supply output signals just to the respective logic inverters 52 in the counter stages ST0, ST1, ST2, ST3, ST4, ST5, ST6, ST7 and ST8. Therefore, each cascade of two logic inverters can be replaced by wire connection in a modification of the FIG. 4 binary synchronous counter. This replacement eliminates the delays in the respective logic inverters 52 of the counter stages ST2, ST4, ST6 and ST8; and this replacement also eliminates the delays D in the logic inverters 71, 73, 75 and 77. The timing of the carries CAR1, CAR3, CAR5 and CAR7 is advanced, but the timing of the carries CAR0, CAR2, CAR4 and CAR6 is not changed by this modification.

Figure 6:
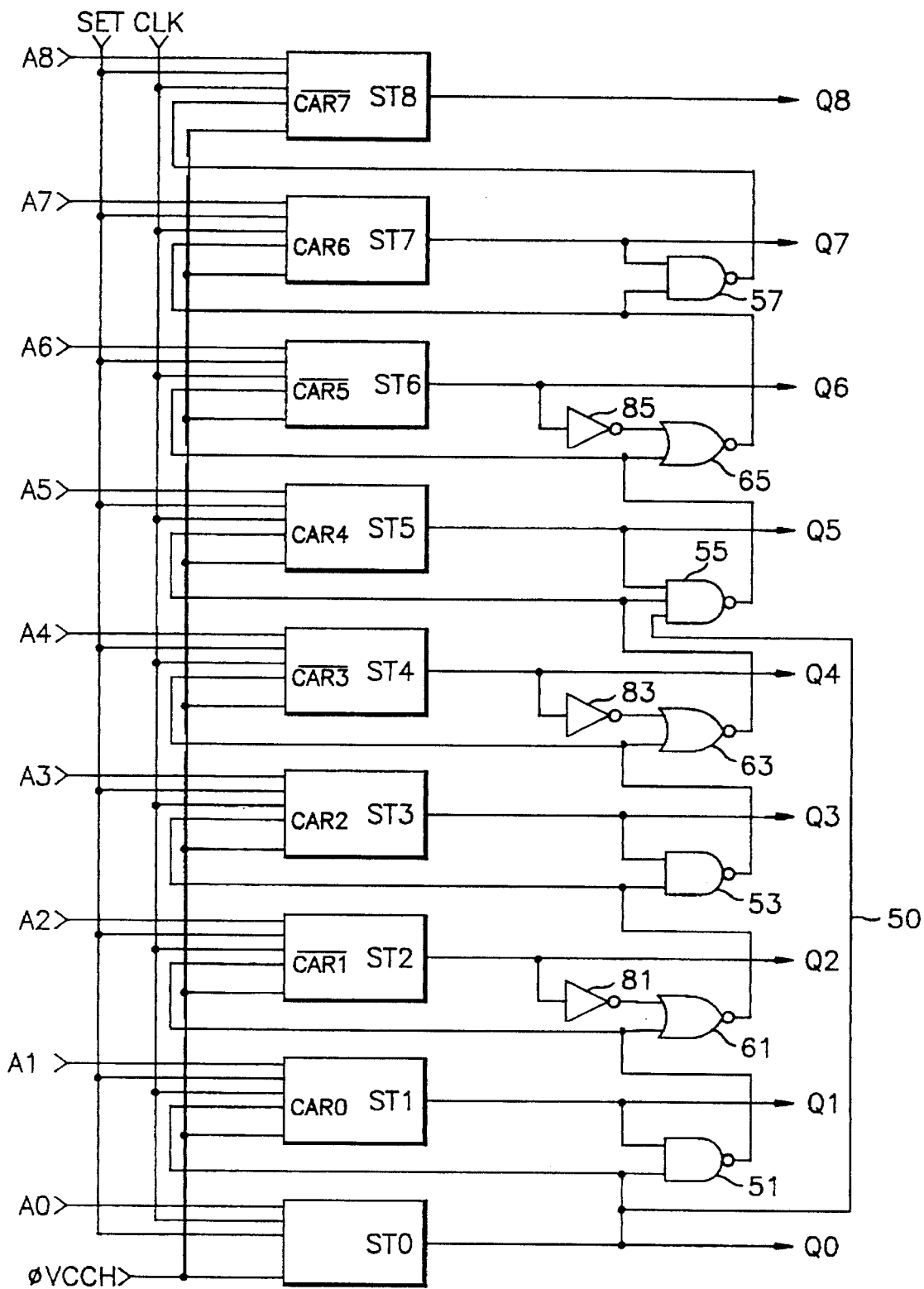
FIGS. 6, 7 and 8 are schematic diagrams of other synchronous binary counters embodying the invention which counters are modifications of the FIG. 4 synchronous binary counter.

FIG. 6 shows the modification of the FIG. 4 synchronous binary counter wherein: the logic inverters 71, 73, 75 and 77 are replaced by respective wire connections; and the counter stages ST2, ST4, ST6 and ST8 are replaced by modified counter stages $ST2_1$, $ST4_1$, $ST6_1$ and $ST8_1$ that do not include respective logic inverters 52.

While FIG. 4 shows the logic inverters 81, 83 and 85 as elements separate from the counter stages ST2, ST4 and ST6, the respective Q2, Q4 and Q6 output signals of which stages the logic inverters 81, 83 and 85 respectively bit complement; a person skilled in the art of digital hardware design and acquainted with the foregoing disclosure will readily recognize that the complemented Q2, Q4 and Q6 output signals often can be obtained from within the counter stages ST2, ST4 and ST6 without need for further logic inverters 81, 83 and 85. In the type of counter stage shown in FIG. 2 a complement $\overline{Q}_i$ of the $Q_i$ output signal is available at the output of the logic inverter 72, for example. The delay for the carry fall times provided by the further logic inverters 81, 83 and 85 will be provided by the respective logic inverter 72 of the counter stages ST2, ST4 and ST6.

Figure 7:
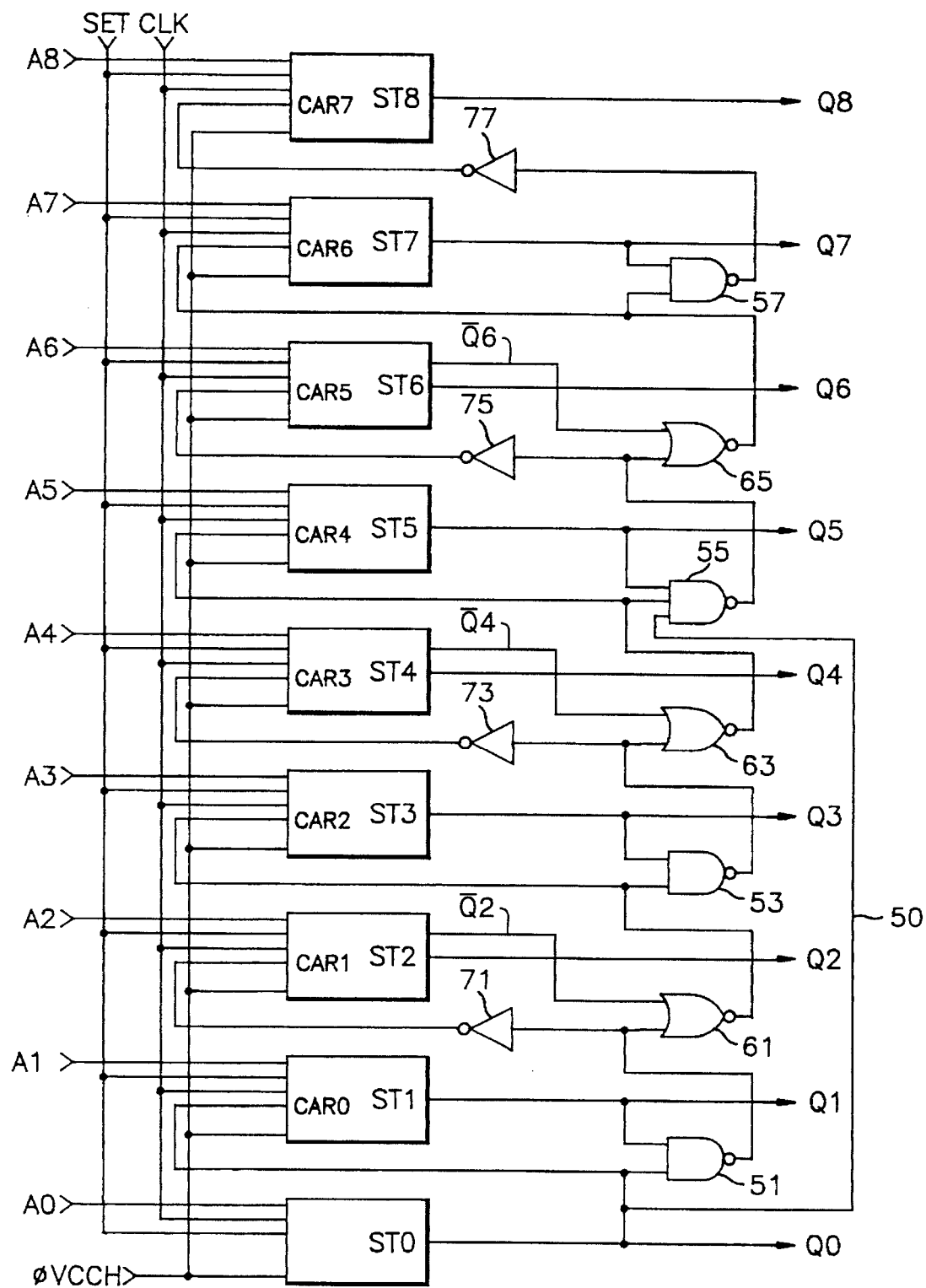
Figure 8:
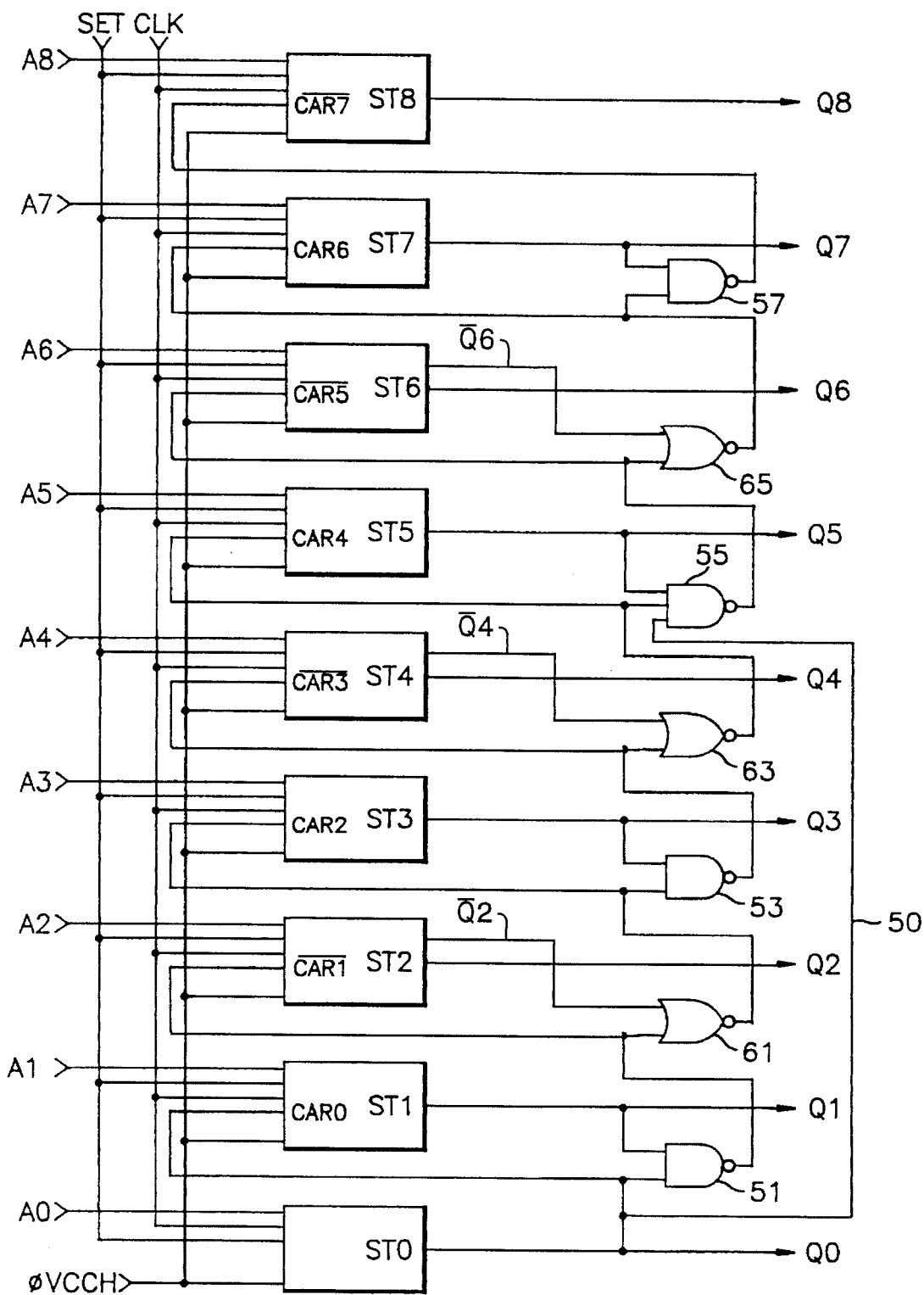

FIG. 7 shows the modification of the FIG. 4 synchronous binary counter wherein: the logic inverters 81, 83 and 85 are replaced by respective wire connections; and the counter stages ST2, ST4 and ST6 are replaced by modified counter stages $ST2_2$, $ST4_2$ and $ST6_2$ that supply $\overline{Q2}$, $\overline{Q4}$ and $\overline{Q6}$ output signals in addition to Q2, Q4 and Q6 output signals. FIG. 8 shows a modification of the FIG. 6 synchronous binary counter wherein: the logic inverters 71, 73, 75, 77, 81, 83 and 85 are replaced by respective wire connections; the counter stage ST8 is replaced by modified counter stage $ST8_1$ that does not include a respective logic inverter 52; and the counter stages ST2, ST4 and ST6 are replaced by modified counter stages $ST2_3$, $ST4_3$ and $ST6_3$ that do not include respective logic inverters 52 and that supply $\overline{Q}_2$, $\overline{Q4}$ and $\overline{Q6}$ output signals in addition to Q2, Q4 and Q6 output signals.

The application of Q0 or CAR0 as an input signal to the third NAND gate 55 in the FIG. 4, 6, 7 or 8 synchronous binary counter is not a necessary feature in all embodiments of the invention. The application of CAR0 as an additional input signal to the third NAND gate 55 assures that the fall time for the CAR5 carry will occur within 1D delay from the fall time of CAR0. This feature is particularly important where there is some likelihood of delay of the synchronous clock applied to the later counter stages with respect to the synchronous clock applied to the earlier counter stages. While FIGS. 4, 6, 7 or 8 may appear to suggest that the synchronous clock CLK is applied to the later stages before the earlier stages, it is generally preferable to arrange that the earlier stages receive the synchronous clock sooner, rather than later, since the valid values of the later stages are not established anyway until carries propagate to them. Applying CAIR0 as an additional input signal to a NAND gate involved with the generation of carries for later counter stage might be done with regard to another NAND gate, such as 57, rather than to the NAND gate 55.

The synchronous binary counter can be adapted for up-counting, for down-counting, for simultaneously up-counting and down-counting, or for counting in a direction selected by applied control signal, as known by those skilled in the art of designing such counters. The synchronous binary counter may be adapted for counting in binary-coded arithmetic using a radix other than two. The carry generation procedures of the invention find use in such counters, and the following claims should be construed accordingly.

What is claimed is:

1. A counter comprising:

a succession of counter stages, including an earlier counter stage in said succession and a next later counter stage in said succession, said earlier counter stage receiving a respective carry input thereto and supplying a respective output signal therefrom, said next later counter stage in said succession receiving a respective carry input thereto and supplying a respective output signal and a respective complemented output signal therefrom;

an earlier carry generation circuit for supplying said carry input to said next later counter stage in said succession, said earlier carry generation circuit including a NAND gate for generating a NAND gate response responsive to said carry input to said earlier counter stage and responsive to said output signal from said earlier counter stage and a logic inverter for converting said NAND gate response to an AND response to said carry input to said earlier counter stage and said output signal from said earlier counter stage, for application with neither modification nor further delay as said respective carry input to said next later counter stage; and a next later carry generation circuit for supplying a carry output applied with neither modification nor further delay to said next later counter stage as its said carry input, said next later carry generation circuit including a NOR gate for generating said carry output as a NOR gate response responsive to said NAND gate response and to said complemented output signal from said next later counter stage.

2. A counter comprising:

a succession of counter stages, including an earlier counter stage in said succession and a next later counter stage in said succession, said earlier counter stage receiving a respective carry input thereto and supplying a respective output signal therefrom, said next later counter stage in said succession receiving a respective carry input thereto and supplying a respective output signal and a respective complemented output signal therefrom, said earlier counter stage being preceded by previous counter stages;

an earlier carry generation circuit for supplying said carry input to said next later counter stage in said succession, said earlier carry generation circuit including a NAND gate generating a NAND gate response, receiving at a first of three inputs thereof a carry input to one of said previous counter stages, receiving at a second of its said three inputs said carry input to said earlier counter stage, and receiving at a third of its said three inputs said output signal from said earlier counter stage and means for applying said respective carry input to said next later counter stage in said succession in response to said NAND gate response; and a next later carry generation circuit for supplying a carry output, said next later carry generation circuit including a NOR gate for generating a NOR gate response responsive to said NAND gate response and to said complemented output signal from said next later counter stage in said succession and means for supplying said carry output in response to said NOR gate response.

3. A counter comprising:

first, second and third counter stages, each having a respective output terminal for supplying a respective output signal that is in a ZERO logic state or in a ONE logic state except when being switched between those logic states;

means responsive to a clock signal for causing said first counter stage to switch its respective output signal from the one of said ZERO and ONE logic states it was previously in to the other of said ZERO and ONE logic states;

means responsive to said clock signal for causing said second counter stage to switch its respective output signal from the one of said ZERO and ONE logic states it was previously in to the other of said ZERO and ONE logic states;

means responsive to said clock signal for causing said third counter stage to switch its respective output signal from the one of said ZERO and ONE logic states it was previously in to the other of said ZERO and ONE logic states;

means responsive to a zeroeth carry signal for causing said first counter stage to switch its respective output signal from the one of said ZERO and ONE logic states it was previously in to the other of said ZERO and ONE logic states;

means responsive to a first carry signal for causing said second counter stage to switch its respective output signal from the one of said ZERO and ONE logic states it was previously in to the other of said ZERO and ONE logic states;

means responsive to a second carry signal for causing said third counter stage to switch its respective output signal from the one of said ZERO and ONE logic states it was previously in to the other of said ZERO and ONE logic states;

a first NAND gate for generating a first NAND gate response, responsive to said zeroeth carry signal and the output signal of said first counter stage;

a first logic inverter for inverting the first NAND gate response to generate, for application with neither modification nor further delay to said second counter stage as said first carry signal, a first AND response to said zeroeth carry signal and the output signal of said first counter stage;

a second logic inverter for inverting the output signal of said second counter stage to generate a second logic inverter response; and a first NOR gate for generating a first NOR gate response, responsive to said first NAND gate response and said second logic inverter response, which said first NOR gate response is applied with neither modification nor further delay to said third counter stage as said second carry signal.

4. A counter as recited in claim 3 further comprising:

a zeroeth counter stage having a respective output terminal for supplying a respective output signal that is in a ZERO logic state or in a ONE logic state except when being switched between those logic states, which said respective output signal corresponds to said zeroeth carry signal.

5. A counter as recited in claim 4 further comprising:

a fourth counter stage having a respective output terminal for supplying a respective output signal that is in a ZERO logic state or in a ONE logic state except when being switched between those logic states;

means responsive to said clock signal for causing said fourth counter stage to switch its respective output signal from the one of said ZERO and ONE logic states it was previously in to the other of said ZERO and ONE logic states;

means responsive to a third carry signal for causing said fourth counter stage to switch its respective output signal from the one of said ZERO and ONE logic states it was previously into the other of said ZERO and ONE logic states;

a second NAND gate third generating a second NAND gate response, responsive to said second carry signal and the output signal of said third counter stage; and a third logic inverter for inverting said second NAND gate response to generate, for application with neither modification nor further delay to said fourth counter stage as said third carry signal, a second AND response to said second carry signal and the output signal of said third counter stage.

6. A counter as recited in claim 3 further comprising:

a fourth counter stage having a respective output terminal for supplying a respective output signal that is in a ZERO logic state or in a ONE logic state except when being switched between those logic states;

means responsive to said clock signal for causing said fourth counter stage to switch its respective output signal from the one of said ZERO and ONE logic states it was previously in to the other of said ZERO and ONE logic states;

means responsive to a third carry signal for causing said fourth counter stage to switch its respective output signal from the one of said ZERO and ONE logic states it was previously in to the other of said ZERO and ONE logic states;

a second NAND gate for generating a second NAND gate response, responsive to said second carry signal and the output signal of said third counter stage; and a third logic inverter for inverting said second NAND gate response to generate, for application with neither modification nor further delay to said fourth counter stage as said third carry signal, a second AND response to said second carry signal and the output signal of said third counter stage.

7. A counter as recited in claim 6 further comprising:

a fifth counter stage having a respective output terminal for supplying a respective output signal that is in a ZERO logic state or in a ONE logic state except when being switched between those logic states;

means responsive to said clock signal for causing said fifth counter stage to switch its respective output signal from the one of said ZERO and ONE logic states it was previously in to the other of said ZERO and ONE logic states;

means responsive to a fourth carry signal for causing said fifth counter stage to switch its respective output signal from the one of said ZERO and ONE logic states it was previously in to the other of said ZERO and ONE logic states;

a fourth logic inverter for inverting the output signal of said fourth counter stage to generate a fourth logic inverter response; and a second NOR gate for generating a second NOR gate response, responsive to said second NAND gate response and said fourth logic inverter response, which said second NOR gate response is applied with neither modification nor further delay to said fifth counter stage as said fourth carry signal.

8. A counter as recited in claim 7 further comprising:

a zeroeth counter stage having a respective output terminal for supplying a respective output signal that is in a ZERO logic state or in a ONE logic state except when being switched between those logic states, which said respective output signal corresponds to said zeroeth carry signal.

9. A counter as recited in claim 7 further comprising:

a sixth counter stage having a respective output terminal for supplying a respective output signal that is in a ZERO logic state or in a ONE logic state except when being switched between those logic states;

means responsive to said clock signal for causing said sixth counter stage to switch its respective output signal from the one of said ZERO and ONE logic states it was previously in to the other of said ZERO and ONE logic states;

means responsive to a fifth carry signal for causing said sixth counter stage to switch its respective output signal from the one of said ZERO and ONE logic states it was previously in to the other of said ZERO and ONE logic states;

a third NAND gate for generating a third NAND gate response, responsive to input signals received at first and second and third inputs thereof, the first input of said third NAND gate connected for receiving said zeroeth carry signal, the second input of said third NAND gate connected for receiving said fourth carry signal, and the third input of said third NAND gate connected for receiving the output signal of said fifth counter stage; and a fifth logic inverter for inverting said third NAND gate response to generate a third AND response to said input signals received at first and second and third inputs of said third NAND gate, for application with neither modification nor further delay to said sixth counter stage as said fifth carry signal.

10. A counter as recited in claim 9 further comprising:

a zeroeth counter stage having a respective output terminal for supplying a respective output signal that is in a ZERO logic state or in a ONE logic state except when being switched between those logic states, which said respective output signal corresponds to said zeroeth carry signal.

11. A counter as recited in claim 9 further comprising:

a seventh counter stage having a respective output terminal for supplying a respective output signal that is in a ZERO logic state or in a ONE logic state except when being switched between those logic states;

means responsive to said clock signal for causing said seventh counter stage to switch its respective output signal from the one of said zero and one logic states it was previously in to the other of said zero and one logic states;

means responsive to a sixth carry signal for causing said seventh counter stage to switch its respective output signal from one of said ZERO and ONE logic states it was previously in to the other of said ZERO and ONE logic states;

a sixth logic inverter for inverting the output signal of said sixth counter stage to generate a sixth logic inverter response; and a third NOR gate for generating a third NOR gate response, responsive to said third NAND gate response and said sixth logic inverter response, which said third NOR gate response is applied with neither modification nor further delay to said seventh counter stage as said sixth carry signal.

12. A counter as recited in claim 11 further comprising:

a zeroeth counter stage having a respective output terminal for supplying a respective output signal that is in a ZERO logic state or in ONE logic state except when being switched between those logic states, which said respective output signal corresponds to said zeroeth carry signal.

13. A counter as recited in claim 11 further comprising:

an eighth counter stage having a respective output terminal for supplying a respective output signal that is in a ZERO logic state or in a ONE logic state except when being switched between those logic states;

means responsive to said clock signal for causing said eighth counter stage to switch its respective output signal from the one of said ZERO and ONE logic states it was previously in to the other of said ZERO and ONE logic states;

means responsive to a seventh carry signal for causing said eighth counter stage to switch its respective output signal from the one of said ZERO and ONE logic states it was previously in to the other of said ZERO and ONE logic states;

a fourth NAND gate for generating a fourth NAND gate response, responsive to said sixth carry signal and the output signal of said seventh counter stage; and a seventh logic inverter for inverting said fourth NAND gate response to generate a fourth AND response to said sixth carry signal and the output signal of said seventh counter stage, for application with neither modification nor further delay to said eighth counter stage as said seventh carry signal.

14. A counter as recited in claim 13 further comprising:

a zeroeth counter stage having a respective output terminal for suppling a respective output signal that is in a ZERO logic state or in a ONE logic state except when being switched between those logic states, which said respective output signal corresponds to said zeroeth carry signal.

15. A counter comprising:

first, second and third counter stages, each having a respective output terminal for supplying a respective output signal that is in a ZERO logic state or in a ONE logic state except when being switched between those logic states;

means responsive to a clock signal for causing said first counter stage to switch its respective output signal from the one of said ZERO and ONE logic states it was previously in to the other of said ZERO and ONE logic states;

means responsive to said clock signal for causing said second counter stage to switch its respective output signal from the one of said ZERO and ONE logic states it was previously in to the other of said ZERO and ONE logic states;

means responsive to said clock signal for causing said third counter stage to switch its respective output signal from the one of said ZERO and ONE logic states it was previously in to the other of said ZERO and ONE logic states;

means responsive to a zeroeth carry signal for causing said first counter stage to switch its respective output signal from the one of said ZERO and ONE logic states it was previously in to the other of said ZERO and ONE logic states;

means responsive to a first carry signal for causing said second counter stage to switch its respective output signal from the one of said ZERO and ONE logic states it was previously in to the other of said ZERO and ONE logic states;

means responsive to a second carry signal for causing said third counter stage to switch its respective output signal from the one of said ZERO and ONE logic states it was previously in to the other of said ZERO and ONE logic states;

a first NAND gate for generating a first NAND gate response, responsive to said zeroeth carry signal and the output signal of said first counter stage, which said first NAND gate response is applied with neither modification nor further delay to said second counter stage as said first carry signal;

a first logic inverter for inverting the output signal of said second counter stage to generate a first logic inverter response; and a first NOR gate for generating a first NOR gate response, responsive to said first NAND gate response and said first logic inverter response, which said first NOR gate response is applied with neither modification nor further delay to said third counter stage as said second carry signal.

16. A counter as recited in claim 15 further comprising:

a zeroeth counter stage having a respective output terminal for supplying a respective output signal that is in a ZERO logic state or in a ONE logic state except when being switched between those logic states, which said respective output signal corresponds to said zeroeth carry signal.

17. A counter as recited in claim 16 further comprising:

a fourth counter stage having a respective output terminal for supplying a respective output signal that is in a ZERO logic state or in a ONE logic state except when being switched between those logic states;

means responsive to said clock signal for causing said fourth counter stage to switch its respective output signal from the one of said ZERO and ONE logic states it was previously in to the other of said ZERO and ONE logic states;

means responsive to a third carry signal for causing said fourth counter stage to switch its respective output signal from the one of said ZERO and ONE logic states it was previously in to the other of said ZERO and ONE logic states; and a second NAND gate for generating a second NAND gate response, responsive to said second carry signal and the output signal of said third counter stage, which said second NAND gate response is applied with neither modification nor further delay to said fourth counter stage as said third carry signal.

18. A counter as recited in claim 15 further comprising:

a fourth counter stage having a respective output terminal for supplying a respective output signal that is in a ZERO logic state or in a ONE logic state except when being switched between those logic states;

means responsive to said clock signal for causing said fourth counter stage to switch its respective output signal from the one of said ZERO and ONE logic states it was previously in to the other of said ZERO and ONE logic states;

means responsive to a third carry signal for causing said fourth counter stage to switch its respective output signal from the one of said ZERO and ONE logic states it was previously in to the other of said ZERO and ONE logic states; and a second NAND gate for generating a second NAND gate response, responsive to said second carry signal and the output of said third counter stage, which said second NAND gate response is applied with neither modification nor further delay to said fourth counter stage as said third carry signal.

19. A counter as recited in claim 18 further comprising:

a fifth counter stage having a respective output terminal for supplying a respective output signal that is in a ZERO logic state or in a ONE logic state except when being switched between those logic states;

means responsive to said clock signal for causing said fifth counter stage to switch its respective output signal from the one of said ZERO and ONE logic states it was previously in to the other of said ZERO and ONE logic states;

means responsive to a fourth carry signal for causing said fifth counter stage to switch its respective output signal from the one of said ZERO and ONE logic states it was previously in to the other of said ZERO and ONE logic states;

a second logic inverter for inverting the output signal of said fourth counter stage to generate a second logic inverter response; and a second NOR gate for generating a second NOR gate response, responsive to said second NAND gate response and said second logic inverter response, which said second NOR gate response is applied with neither modification nor further delay to said fifth counter stage as said fourth carry signal.

20. A counter as recited in claim 19 further comprising:

a zeroeth counter stage having a respective output terminal for supplying a respective output signal that is in a ZERO logic state or in a ONE logic state except when being switched between those logic states, which said respective output signal corresponds to said zeroeth carry signal.

21. A counter as recited in claim 19 further comprising:

a sixth counter stage having a respective output terminal for supplying a respective output signal that is in a ZERO logic state or in a ONE logic state except when being switched between those logic states;

means responsive to said clock signal for causing said sixth counter stage to switch its respective output signal from the one of said ZERO and ONE logic states it was previously in to the other of said ZERO and ONE logic states;

means responsive to a fifth carry signal for causing said sixth counter stage to switch its respective output signal from the one of said ZERO and ONE logic states it was previously in to the other of said ZERO and ONE logic states; and a third NAND gate for generating a third NAND gate response, responsive to said fourth carry signal and the output signal of said fifth counter stage, which said third NAND gate response is applied with neither modification nor further delay to said sixth counter stage as said fifth carry signal.

22. A counter as recited in claim 21 further comprising:

a zeroeth counter stage having a respective output terminal for supplying a respective output signal that is in a ZERO logic state or in a ONE logic state except when being switched between those logic states, which said respective output signal corresponds to said zeroeth carry signal.

23. A counter as recited in claim 21 further comprising:

a seventh counter stage having a respective output terminal for supplying a respective output signal that is in a ZERO logic state or in a ONE logic state except when being switched between those logic states;

means responsive to said clock signal for causing said seventh counter stage to switch its respective output signal from the one of said ZERO and ONE logic states it was previously in to the other of said ZERO and ONE logic states;

means responsive to a sixth carry signal for causing said seventh counter stage to switch its respective output signal from the one of said ZERO and ONE logic states it was previously in to the other of said ZERO and ONE logic states;

a third logic inverter for inverting the output signal of said sixth counter stage to generate a third logic inverter response; and a third NOR gate for generating a third NOR gate response, responsive to said third NAND gate response and said third logic inverter response, which said third NOR gate response is applied with neither modification nor further delay to said seventh counter stage as said sixth carry signal.

24. A counter as recited in claim 23 further comprising:

a zeroeth counter stage having respective output terminal for supplying a respective output signal that is in a ZERO logic state or in a ONE logic state except when being switched between those logic states, which said respective output signal corresponds to said zeroeth carry signal.

25. A counter as recited in claim 23 further comprising:

an eighth counter stage having a respective output terminal for supplying a respective output signal that is in a ZERO logic state or in a ONE logic state except when being switched between those logic states;

means responsive to said clock signal for causing said eighth counter stage to switch its respective output signal from the one of said ZERO and ONE logic states it was previously in to the other of said ZERO and ONE logic states;

means responsive to a seventh carry signal for causing said eighth counter stage to switch its respective output signal from the one of said ZERO and ONE logic states it was previously in to the other of said ZERO and ONE logic states; and a fourth NAND gate for generating a fourth NAND gate response, responsive to said sixth carry signal and the output signal of said seventh counter stage, which said fourth NAND gate response is applied with neither modification nor further delay to said eighth counter stage as said seventh carry signal.

26. A counter as recited in claim 25 further comprising:

a zeroeth counter stage having a respective output terminal for supplying a respective output signal that is in a ZERO logic state or in a ONE logic state except when being switched between those logic states, which said respective output signal corresponds to said zeroeth carry signal.

27. A counter comprising:

first, second and third counter stages, each having a respective first output terminal for supplying a respective first output signal that is in a ZERO logic state or in a ONE logic state except when being switched between those logic states, said second counter stage having a respective second output terminal for supplying a respective second output signal that is in a ZERO logic state when its first output signal is in a ONE logic state and that is in a ONE logic state when its first output signal is in a ZERO logic state;

means responsive to a clock signal for causing said first counter stage to switch each of its respective first and second output signals from the one of said ZERO and ONE logic states it was previously in to the other of said ZERO and ONE logic states;

means responsive to said clock signal for causing said second counter stage to switch each of its respective first and second output signals from the one of said ZERO and ONE logic states it was previously in to the other of said ZERO and ONE logic states;

means responsive to said clock signal for causing said third counter stage to switch each of its respective first and second output signals from the one of said ZERO and ONE logic states it was previously in to the other of said ZERO and ONE logic states;

means responsive to a zeroeth carry signal for causing said first counter stage to switch each of its respective first and second output signals from the one of said ZERO and ONE logic states it was previously in to the other of said ZERO and ONE logic states;

means responsive to a first carry signal for causing said second counter stage to switch each of its respective first and second output signals from the one of said ZERO and ONE logic states it was previously in to the other of said ZERO and ONE logic states;

means responsive to a second carry signal for causing said third counter stage to switch each of its respective first and second output signals from the one of said ZERO and ONE logic states it was previously in to the other of said ZERO and ONE logic states;

a first NAND gate for generating a first NAND gate response, responsive to said zeroeth carry signal and the output signal of said first counter stage;

a first logic inverter for inverting the first NAND gate response to generate, for application with neither modification nor further delay to said second counter stage as said first carry signal, a first AND response to said zeroeth carry signal and the output signal of said first counter stage; and a first NOR gate for generating a first NOR gate response, responsive to said first NAND gate response and the second output signal of said second counter stage, which said first NOR gate response is applied with neither modification nor further delay to said third counter stage as said second carry signal.

28. A counter as recited in claim 27 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

29. A counter as recited in claim 28 further comprising:

a fourth counter stage, having a respective first output terminal for supplying a respective output signal that is in a ZERO logic state or in a ONE logic state except when being switched between those logic states, and having a respective second output terminal for supplying a respective second output signal that is in a ZERO logic state when its first output signal is in a ONE logic state and that is in a ONE logic state when its first output signal is in a ZERO logic state;

means responsive to said clock signal for causing said fourth counter stage to switch each of its respective first and second output signals from the one of said ZERO and ONE logic states it was previously in to the other of said ZERO and ONE logic states;

means responsive to a third carry signal for causing said fourth counter stage to switch each of its respective first and second output signals from the one of said ZERO and ONE logic states it was previously in to the other of said ZERO and ONE logic states;

a second NAND gate first generating a second NAND gate response, responsive to said second carry signal and the output signal of said third counter stage; and a second logic inverter for inverting said second NAND gate response to generate a second AND response, responsive to said second carry signal and the output signal of said third counter stage, applied with neither modification nor further delay to said fourth counter stage as said third carry signal.

30. A counter as recited in claim 27 further comprising:

a fourth counter stage, having a respective first output terminal for supplying a respective output signal that is in a ZERO logic state or in ONE logic state except when being switched between those logic states, and having a respective second output terminal for supplying a respective second output signal that is in a ZERO logic state when its first output signal is in a ONE logic state and that is in a ONE logic state when its first output signal is in a ZERO logic state;

means responsive to said clock signal for causing said fourth counter stage to switch each of its respective first and second output signals from the one of said ZERO and ONE logic states it was previously in to the other of said ZERO and ONE logic states;

means responsive to a third carry signal for causing said fourth counter stage to switch each of its respective first and second output signals from the one of said ZERO and ONE logic states it was previously in to the other of said ZERO and ONE logic states;

a second NAND gate for generating a second NAND gate response, responsive to said second cary signal and the output signal of said third counter stage; and a second logic inverter for inverting said second NAND gate response to generate a second AND response, responsive to said second carry signal and the output signal of said third counter stage, which said second AND response is applied with neither modification nor further delay to said fourth counter stage as said third carry signal.

31. A counter as recited in claim 30 further comprising a fifth counter stage having a respective first output terminal for supplying a respective first output signal that is in a ZERO logic state or in a ONE logic state except when being switched between those logic states;

means responsive to said clock signal for causing said fifth counter stage to switch its respective first output signal from the one of said ZERO and ONE logic states it was previously in to the other of said ZERO and ONE logic states;

means responsive to a fourth carry signal from causing fifth counter stage to switch its responsive first output signal from the one of said ZERO and ONE logic states it was previously in to the other of said ZERO and ONE logic states; and a second NOR gate for generating a second NOR gate response, responsive to said second NAND gate response and the second output signal of said fourth counter stage, which said second NOR gate response is applied with neither modification nor further delay to fifth counter stage as said fourth carry signal.

32. A counter as recited in claim 31 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

33. A counter as recited in claim 31 further comprising:

a sixth counter stage, having a respective first output terminal for supplying a respective output signal that is in a ZERO logic state or in a ONE logic state except when being switched between those logic states, and having a respective second output terminal for supplying a respective second output signal that is in a ZERO logic state when its first output signal is in a ONE logic state and that is in a one logic state when its first output signal is in a ZERO logic state;

means responsive to said clock signal for causing said sixth counter stage to switch each of its respective first and second output signals from the one of said ZERO and ONE logic states it was previously in to the other of said ZERO and ONE logic states;

means responsive to a fifth carry signal for causing said sixth counter stage to switch each of its respective first and second output signals from the one of said ZERO and ONE logic states previously in to the other of said ZERO and ONE logic states; a third NAND gate for generating a third NAND gate response, responsive to input signals received at first and second and third input thereof, the first input of said third NAND gate connected for receiving said zeroeth carry signal, the second input of said third NAND gate connected for receiving said fourth carry signal, and the third input of said third NAND gate connected for receiving the output signal of said fifth counter stage; and a third logic inverter for inverting said third NAND gate response to generate a third AND response to said input signals received at first and second and third inputs of said third NAND gate, for application with neither modification nor further delay to said sixth counter stage as said fifth carry signal.

34. A counter as recited in claim 33 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

35. A counter as recited in claim 33 further comprising:

a seventh counter stage having a respective first output terminal for supplying a respective first output signal that is in a ZERO logic state or in a ONE logic state except when being switched between those logic states;

means responsive to said clock signal for causing said seventh counter stage to switch its respective first output signal from the one of said ZERO and ONE logic states it was previously in to the other of said ZERO and ONE logic states;

means responsive to a sixth carry signal for causing said seventh counter stage to switch its respective first output signal from the one of said ZERO and ONE logic states it was previously in to the other of said ZERO and ONE logic states; and a third NOR gate for generating a third NOR gate response, respeonsive to said third NAND gate response and the second output signal of said sixth counter stage, which said third NOR gate response is applied with neither modification nor further delay tos aid seventh counter stage said sixth carry signal.

36. A counter as recited in claim 35 further comprising:

a zeroeth counter stage having a respective first output terminal for supplying a respective first output signal that is in a ZERO logic state or in a ONE logic states except when being switched between those logic states, which said respective first output signal corresponds to said zeroeth carry signal.

37. A counter as recited in claim 35 further comprising:

an eighth counter stage, having a respective first output terminal for supplying a respective output signal that is in a ZERO logic state or in a ONE logic state except when being switched between those logic states, and having a respective second output terminal for supplying a respective second output signal that is in a ZERO logic state when its first output signal is in a ONE logic state and that is in a ONE logic state when its first output signal is in a ZERO logic state;

means responsive to said clock signal for causing said eighth counter stage to switch each of its respective first and second output signals from the one of said ZERO and ONE logic states it was previously in to the other of said ZERO and ONE logic states;

means responsive to a seventh carry signal for causing said eighth counter stage to switch each of its respective first and second output signals from the one of said ZERO and ONE logic states it was previously in to the other of said ZERO and ONE logic states;

a fourth NAND gate for generating a fourth NAND gate response, responsive to said sixth carry signal and the output signal of said seventh counter stage; and a fourth logic inverter for inverting said fourth NAND gate response, to generate a fourth AND response to said sixth carry signal and the output signal to said seventh counter stage, for application with neither modification nor further delay to said eighth counter stage as said seventh carry signal.

38. A counter as recited in claim 37 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

39. A counter comprising:

first, second and third counter stages, each having a respective first output terminal for supplying a respective first output signal that is in a ZERO logic state or in a ONE logic state except when being switched between those logic states, said second counter stage having a respective second output terminal for supplying a respective second output signal that is in a ZERO logic state when its first output signal is in a ONE logic state and that is in a ONE logic state when its first output signal is in a ZERO logic state;

means responsive to a clock signal for causing said first counter stage to switch each of its respective first and second output signals from the one of said ZERO and ONE logic states it was previously in to the other of said ZERO and ONE logic states;

means responsive to said clock signal for causing said second counter stage to switch each of its respective first and second output signals from the one of said ZERO and ONE logic states it was previously in to the other of said ZERO and ONE logic states;

means responsive to said clock signal for causing said third counter stage to switch each of its respective first and second output signals from the one of said ZERO and ONE logic states it was previously in to the other of said ZERO and ONE logic states;

means responsive to a zeroeth carry signal for causing said first counter stage to switch each of its respective first and second output signals from the one of said ZERO and ONE logic states it was previously in to the other of said ZERO and ONE logic states;

means responsive to a first carry signal for causing said second counter stage to switch each of its respective first and second output signals from the one of said ZERO and ONE logic states it was previously in to the other of said ZERO and ONE logic states;

means responsive to a second carry signal for causing said third counter stage to switch each of its respective first and second output signals from the one of said ZERO and ONE logic states it was previously in to the other of said ZERO and ONE logic states;

a first NAND gate for generating a first NAND gate response, responsive to said zeroeth carry signal and the output signal of said first counter stage, which said first NAND gate response is applied with neither modification nor further delay to said second counter stage as said first carry signal; and a first NOR gate for generating a first NOR gate response, responsive to said first NAND gate response and the second output signal of said second counter stage, which said first NOR gate response is applied with neither modification nor further delay to said third counter stage as said second carry signal.

40. A counter as recited in claim 39 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

41. A counter as recited in claim 40 further comprising:

a fourth counter stage, having a respective first output terminal for supplying a respective output signal that is in a ZERO logic state or in a ONE logic state except when being switched between those logic states, and having a respective second output terminal for supplying a respective second output signal that is in a ZERO logic state when its first output signal is in a ONE logic state and that is in a ONE logic state when its first output signal is in a ZERO logic state;

means responsive to said clock signal for causing said fourth counter stage to switch each of its respective first and second output signals from the one of said ZERO and ONE logic states it was previously in to the other of said ZERO and ONE logic states;

means responsive to a third carry signal for causing said fourth counter stage to switch each of its respective first and second output signals from the one of said ZERO and ONE logic states it was previously in to the other of said ZERO and ONE logic states; and a second NAND gate for generating a second NAND gate response, responsive to said second carry signal and the output signal of said third counter stage, which said second NAND gate response is applied with neither modification nor further delay to said fourth counter stage as said third carry signal.

42. A counter as recited in claim 39 further comprising:

a fourth counter stage, having a respective first output terminal for supplying a respective output signal that is in a ZERO logic state or in a ONE logic state except when being switched between those logic states, and having a respective second output terminal for supplying a respective second output signal that is in a ZERO logic state when its first output signal is in a ONE logic state and that is in a ONE logic state when its first output signal is in a ZERO logic state;

means responsive to said clock signal for causing said fourth counter stage to switch each of its respective first and second output signals from the one of said ZERO and ONE logic states it was previously in to the other of said ZERO and ONE logic states;

means responsive to a third carry signal for causing said fourth counter stage to switch each of its respective first and second output signals from the one of said ZERO and ONE logic states it was previously in to the other of said ZERO and ONE logic states; and a second NAND gate for generating a second NAND gate response, responsive to said second carry signal and the output signal of said third counter stage, which said second NAND gate response is applied with neither modification nor further delay to said fourth counter stage as said third carry signal.

43. A counter as recited in claim 42 further comprising:

a fifth counter stage having a respective first output terminal for supplying a respective first output signal that is in a ZERO logic state or in a ONE logic state except when being switched between those logic states;

means responsive to said clock signal for causing said fifth counter stage to switch its respective first output signal from the one of said ZERO and ONE logic states it was previously in to the other of said ZERO and ONE logic states;

means responsive to a fourth carry signal for causing said fifth counter stage to switch its respective first output signal from the one of said ZERO and ONE logic states it was previously in to the other of said ZERO and ONE logic states; and a second NOR gate for generating a second NOR gate response, responsive to said second NAND gate response and the second output signal of said fourth counter stage, which said second NOR gate response is applied with neither modification nor further delay to said fifth counter stage as said fourth carry signal.

44. A counter as recited in claim 43 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

45. A counter as recited in claim 43 further comprising:

a sixth counter stage, having a respective first output terminal for supplying a respective output signal that is in a ZERO logic state or in a ONE logic state except when being switched between those logic states, and having a respective second output terminal for supplying a respective second output signal that is in a ZERO logic state when its first output signal is in a ONE logic state and that is in a ONE logic state when its first output signal is in a ZERO logic state;

means responsive to a fifth carry signal for causing said sixth counter stage to switch each of its respective first and second output signals from the one of said ZERO and ONE logic states it was previously in to the other of said ZERO and ONE logic states; and a third NAND gate the generating a third NAND gate response, responsive to input signals received at first and second and third inputs thereof, the first input of said third NAND gate connected for receiving said zeroeth carry signal, the second input of said third NAND gate connected for receiving said fourth carry signal, and the third input of said third NAND gate connected for receiving the output signal of said fifth counter stage, which said third NAND gate response is applied with neither modification nor further delay to said sixth counter stage as said fifth carry signal.

46. A counter as recited in claim 45 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

47. A counter as recited in claim 45 further comprising:

a seventh counter stage having a respective first output terminal for supplying a respective first output signal that is in a ZERO logic state or in a ONE logic state except when being switched between those logic states;

means responsive to said clock signal for causing said seventh counter stage to switch its respective first output signal from the one of said ZERO and ONE logic states it was previously in to the other of said ZERO and ONE logic states;

means responsive to a sixth carry signal for causing said seventh counter stage to switch its respective first output signal from the one of said ZERO and ONE logic states it was previously in to the other of said ZERO and ONE logic states; and a third NOR gate for generating a third NOR gate response, responsive to said third NAND gate response and the second output signal of said sixth counter stage, which said third NOR gate response is applied with neither modification nor further delay to said seventh counter stage as said sixth carry signal.

48. A counter as recited in claim 47 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

49. A counter as recited in claim 47 further comprising:

an eighth counter stage, having a respective first output terminal for supplying a respective output signal that is in a ZERO logic state or in a ONE logic state except when being switched between those logic states, and having a respective second output terminal for supplying a respective second output signal that is in a ZERO logic state when its first output signal is in a ONE logic state and that is in a ONE logic state when its first output signal is in a ZERO logic state;

means responsive to said clock signal for causing said eighth counter stage to switch each of its respective first and second output signals from the one of said ZERO and ONE logic states it was previously in to the other of said ZERO and ONE logic states;

means responsive to a seventh carry signal for causing said eighth counter stage to switch each of its respective first and second output signals from the one of said ZERO and ONE logic states it was previously in to the other of said ZERO and ONE logic states; and a fourth NAND gate for generating a fourth NAND gate response, responsive to said sixth carry signal and the output signal of said seventh counter stage, which said fourth NAND gate response is applied with neither modification nor further delay to said eighth counter stage as said seventh carry signal.

50. A counter as recited in claim 49 further comprising:

a zeroeth counter stage having a respective first output terminal for supplying a respective first output signal that is in a ZERO logic state or in a ONE logic state except when being switched between those logic states, which said respective first output signal corresponds to said zeroeth carry signal.

* * * * *